(12) United States Patent
Kishino et al.

(10) Patent No.: US 11,722,121 B2
(45) Date of Patent: Aug. 8, 2023

(54) ACOUSTIC WAVE ELEMENT

(71) Applicant: KYOCERA Corporation, Kyoto (JP)

(72) Inventors: Tetsuya Kishino, Nara (JP); Motoki Ito, Ikoma (JP)

(73) Assignee: KYOCERA Corporation, Kyoto (JP)

( * ) Notice: Subject to any disclaimer, the term of this patent is extended or adjusted under 35 U.S.C. 154(b) by 919 days.

(21) Appl. No.: 16/485,759

(22) PCT Filed: Feb. 14, 2018

(86) PCT No.: PCT/JP2018/005063
§ 371 (c)(1),
(2) Date: Aug. 13, 2019

(87) PCT Pub. No.: WO2018/151147
PCT Pub. Date: Aug. 23, 2018

(65) Prior Publication Data
US 2020/0028486 A1 Jan. 23, 2020

(30) Foreign Application Priority Data

Feb. 14, 2017 (JP) .................... 2017-025276
Feb. 14, 2017 (JP) .................... 2017-025277
Feb. 14, 2017 (JP) .................... 2017-025278

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/02559* (2013.01); *H03H 9/14541* (2013.01)

(58) Field of Classification Search
CPC ... H03H 9/25; H03H 9/02559; H03H 9/14541
See application file for complete search history.

(56) References Cited

U.S. PATENT DOCUMENTS

2004/0226162 A1  11/2004  Miura et al.
2010/0108248 A1   5/2010  Hayakawa et al.
(Continued)

FOREIGN PATENT DOCUMENTS

JP   2004-343359 A   12/2004
JP   2006319679 A    11/2006
(Continued)

*Primary Examiner* — Samuel S Outten
(74) *Attorney, Agent, or Firm* — Procopio Cory Hargreaves and Savitch LLP

(57) ABSTRACT

An acoustic wave element includes an IDT electrode including electrode fingers, a first substrate on an upper surface of which the IDT electrode is located, which has a thickness of less than 2 times a repetition interval of the electrode fingers and is configured by a piezoelectric crystal, a second substrate bonded to a lower surface of the first substrate, and configured by an Si single crystal having a plane orientation of a (100) plane or (110) plane or a plane equal to them, in which substrate a crystal axis of the Si single crystal parallel to a substrate surface of Si single crystal is inclined at any angle of 25° to 65°, 115° to 155°, 205° to 245°, and 295° to 345° relative to a direction of propagation of an acoustic wave when viewed from the upper surface of the superposed first substrate.

15 Claims, 32 Drawing Sheets

(56) References Cited

U.S. PATENT DOCUMENTS

| | | |
|---|---|---|
| 2010/0244631 A1 | 9/2010 | Kobayashi et al. |
| 2012/0194032 A1* | 8/2012 | Kadota .............. H03H 9/02559 |
| | | 310/313 A |
| 2013/0187730 A1 | 7/2013 | Nishizawa et al. |
| 2013/0285768 A1 | 10/2013 | Watanabe et al. |
| 2017/0063333 A1* | 3/2017 | Gilbert .............. H03H 9/02574 |
| 2017/0222619 A1 | 8/2017 | Iwamoto et al. |

FOREIGN PATENT DOCUMENTS

| | | |
|---|---|---|
| JP | 2010-109909 A | 5/2010 |
| JP | 2010-232725 A | 10/2010 |
| JP | 2013-153289 A | 8/2013 |
| JP | 2015-073331 A | 4/2015 |
| WO | 2011/046117 A1 | 4/2011 |
| WO | 2016/084526 A1 | 6/2016 |

* cited by examiner

FIG. 31

| LT [p] | Si (111) | | |
|---|---|---|---|
| | φ | θ | ψ |
| 0.4 | -45 | -55 | 10-110 |
| 0.5 | -45 | -55 | 30-100 |
| 0.6 | -45 | -55 | 30-80 |
| 0.7 | -45 | -55 | 30-80 |
| 0.8 | -45 | -55 | - |
| 0.9 | -45 | -55 | 40-80 |
| 1 | -45 | -55 | 40-80 |
| 1.1 | -45 | -55 | 50-70 |
| 1.2 | -45 | -55 | - |

ψ + 120 × α (α = 0,1,2)

POINT WHERE
MAXSP < ABOUT -50DEG STANDS

| LT [p] | Si (110) | | |
|---|---|---|---|
| | φ | θ | ψ |
| 0.4 | -45 | -90 | -70-70 |
| 0.5 | -45 | -90 | -60-60 |
| 0.6 | -45 | -90 | -60-60 |
| 0.7 | -45 | -90 | -70-70 |
| 0.8 | -45 | -90 | -60-60 |
| 0.9 | -45 | -90 | - |
| 1 | -45 | -90 | - |
| 1.1 | -45 | -90 | - |
| 1.2 | -45 | -90 | - |

ψ + 180 × α (α = 0,1)

POINT WHERE
MAXSP < ABOUT -50DEG STANDS

| LT [p] | Si (100) | | |
|---|---|---|---|
| | φ | θ | ψ |
| 0.4 | 90 | 90 | 20-70 |
| 0.5 | 90 | 90 | 20-70 |
| 0.6 | 90 | 90 | 20-70 |
| 0.7 | 90 | 90 | 20-70 |
| 0.8 | 90 | 90 | 30-60 |
| 0.9 | 90 | 90 | - |
| 1 | 90 | 90 | - |
| 1.1 | 90 | 90 | - |
| 1.2 | 90 | 90 | - |

ψ + 90 × α (α = 0,1,2,3)

REGION WHERE
MAXSP BECOMES SMALL

MAXSP: MAXIMUM PHASE

FIG. 32

| LT [p] | Si (111) φ | θ | ψ |
|---|---|---|---|
| 0.4 | -45 | -54.7 | 20-100 |
| 0.5 | -45 | -54.7 | 20-100 |
| 0.6 | -45 | -54.7 | 30-90 |
| 0.7 | -45 | -54.7 | 30-80 |
| 0.8 | -45 | -54.7 | 40,70 |
| 0.9 | -45 | -54.7 | 40-80 |
| 1 | -45 | -54.7 | 40-80 |
| 1.1 | -45 | -54.7 | 50-70 |
| 1.2 | -45 | -54.7 | - |

$\psi + 120 \times \alpha \ (\alpha = 0, 1, 2)$

POINT WHERE
MAXSP < ABOUT -50DEG STANDS

| LT [p] | Si (110) φ | θ | ψ |
|---|---|---|---|
| 0.4 | -45 | -90 | -70-70 |
| 0.5 | -45 | -90 | -60-60 |
| 0.6 | -45 | -90 | -60-60 |
| 0.7 | -45 | -90 | -60-60 |
| 0.8 | -45 | -90 | -60-60 |
| 0.9 | -45 | -90 | -30-30 |
| 1 | -45 | -90 | -20,20 |
| 1.1 | -45 | -90 | -20-20 |
| 1.2 | -45 | -90 | -10-10 |

$\psi + 120 \times \alpha \ (\alpha = 0, 1, 2)$

REGION WHERE
MAXSP BECOMES SMALL

| LT [p] | Si (100) φ | θ | ψ |
|---|---|---|---|
| 0.4 | 90 | 90 | 20-70 |
| 0.5 | 90 | 90 | 20-70 |
| 0.6 | 90 | 90 | 20-70 |
| 0.7 | 90 | 90 | 20-70 |
| 0.8 | 90 | 90 | 30-60 |
| 0.9 | 90 | 90 | 30-60 |
| 1 | 90 | 90 | - |
| 1.1 | 90 | 90 | - |
| 1.2 | 90 | 90 | - |

$\psi + 90 \times \alpha \ (\alpha = 0, 1, 2, 3)$

REGION WHERE
MAXSP BECOMES SMALL

MAXSP: MAXIMUM PHASE

ACOUSTIC WAVE ELEMENT

TECHNICAL FIELD

The present invention relates to an acoustic wave element.

BACKGROUND ART

Conventionally, it has been known to fabricate an acoustic wave element by providing an electrode on a composite substrate formed by bonding a support substrate and a piezoelectric substrate to each other for the purpose of improving the electrical characteristics. Here, the acoustic wave element is for example used as a bandpass filter in a mobile phone or another communication apparatus. Further, as the composite substrate, there is known one using lithium niobate or lithium tantalate as the piezoelectric substrate and using silicon, quartz, ceramic or the like as the support substrate (see for example Japanese Patent Publication No. 2006-319679).

SUMMARY OF INVENTION

Technical Problem

However, in recent years, portable terminal devices used in mobile communications have been increasingly reduced in size and lightened in weight. Further, in order to realize a high communication quality, an acoustic wave element provided with further higher electrical characteristics has been demanded. For example, in order to reduce leakage of an input/output signal to a neighboring channel, an acoustic wave element excellent in attenuation characteristic in a specific frequency band out of the passband has been demanded.

The present disclosure is made in consideration with such a subject and has as an object thereof to provide an acoustic wave element excellent in electrical characteristics.

Solution to Problem

An acoustic wave element in the present disclosure includes an IDT electrode, a first substrate, and a second substrate. The IDT electrode includes a plurality of electrode fingers and excites a surface acoustic wave. The first substrate is configured by a piezoelectric crystal and includes an upper surface and a lower surface. The second substrate is directly or indirectly bonded on the lower surface. The IDT electrode is located on the upper surface. Further, a thickness of the first substrate is less than a wavelength $\lambda$ of the surface acoustic wave defined by 2 times a repetition interval of the plurality of electrode fingers. The second substrate is bonded to the lower surface of the first substrate and is configured by a material satisfying Equation (1) where an acoustic impedance is I (MRayl) and a transverse acoustic wave velocity is V (m/s).

$$-0.0085 \times V + 45.75 \leq I \leq -0.0085 \times V + 65.75 \qquad (1)$$

Further, an acoustic wave element in the present disclosure includes an IDT electrode, a first substrate, and a second substrate. The IDT electrode includes a plurality of electrode fingers and excites the surface acoustic wave. The first substrate is configured by a piezoelectric crystal and includes an upper surface and a lower surface. The second substrate is directly or indirectly bonded on the lower surface. The IDT electrode is located on the upper surface and has a thickness less than a wavelength $\lambda$ of the surface acoustic wave defined by 2 times a repetition interval of the plurality of electrode fingers. The second substrate is bonded to the lower surface of the first substrate and is configured by an Si single crystal with a plane orientation of the (100) plane or (110) plane or plane orientation equal to them and in which a crystal axis of the Si single crystal parallel to an upper surface of the second substrate is inclined at any of angles 25° to 65°, 115° to 155°, 205° to 254°, and 295° to 345° relative to a direction of propagation of the acoustic wave when viewed from the upper surface of the superposed first substrate.

Further, another acoustic wave element in the present disclosure includes an IDT electrode, a first substrate, an intermediate layer, and a second substrate. The IDT electrode includes a plurality of electrode fingers and excites the surface acoustic wave. The first substrate is provided with the IDT electrode located on an upper surface thereof and is configured by a piezoelectric crystal having a thickness less than a wavelength $\lambda$ of the surface acoustic wave defined by 2 times a repetition interval of the plurality of electrode fingers. The intermediate layer includes a first surface and a second surface. The first surface is bonded to a lower surface of the first substrate. This layer is configured by a material having a slower transverse acoustic wave velocity than that of the first substrate. The second substrate is configured by an Si single crystal bonded to the second surface.

Advantageous Effect of Invention

According to the above configuration, an acoustic wave element excellent in electrical characteristics can be provided.

BRIEF DESCRIPTION OF DRAWINGS

FIG. 1A is an upper surface view of a composite substrate according to the present disclosure, while

FIG. 31 illustrates tables summarizing the correlation among the thickness of the first substrate, the propagation angle of the second substrate, and the maximum phase value of a bulk wave spurious resonance in the SAW element 30.

FIG. 32 illustrates tables summarizing the correlations among the thickness of the first substrate, the propagation angle of the second substrate, and the maximum phase value of a bulk wave spurious resonance in the SAW element 30A.

DESCRIPTION OF EMBODIMENTS

Below, an example of an acoustic wave element of the present disclosure will be explained in detail by using the drawings.

Embodiment: Acoustic Wave Element 30

(Composite Substrate)

Figure 1A:
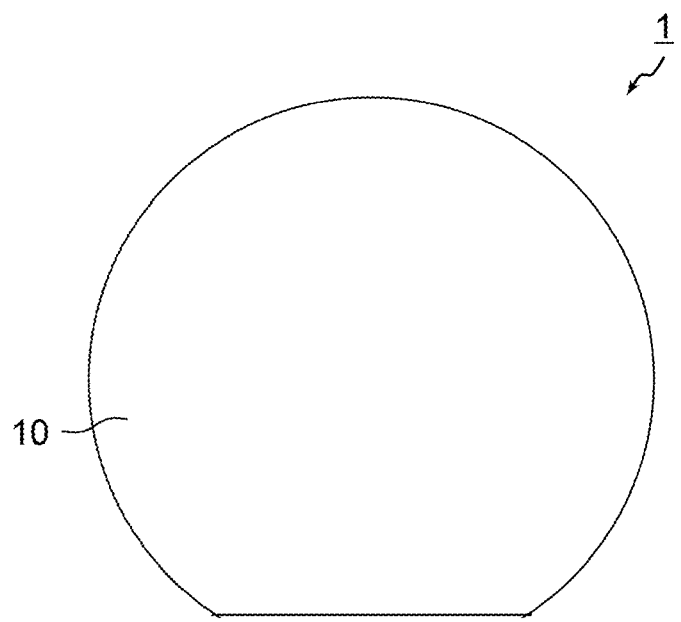
Figure 1B:
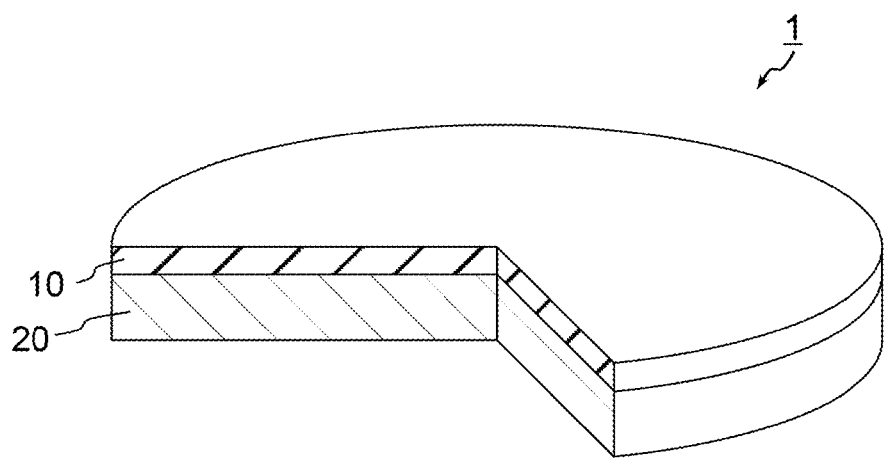
FIG. 1B is a partially cutaway perspective view of FIG. 1A.

A composite substrate 1 in the present embodiment, as shown in FIG. 1, is a so-called bonded substrate and is comprised of a first substrate 10 and a second substrate 20 which is directly or indirectly bonded to the first substrate. Here, FIG. 1A is an upper surface view of the composite substrate 1, and FIG. 1B shows a perspective view cutting away part of the composite substrate 1.

The first substrate 10 is formed by a piezoelectric material. In this example, the first substrate 10 is comprised of a substrate of a single crystal having a piezoelectric characteristic comprised of lithium tantalate ($LiTaO_3$, below, referred to as "LT"). Specifically, for example, the first substrate 10 is comprised of a 36° to 55° Y-X cut LT substrate.

The thickness of the first substrate 10 is constant and is less than 1λ in terms of wavelength ratio. More specifically, it may be set to less than 0.8λ or set to 0.2λ to 0.6λ. Here, the wavelength is defined by 2 times a repetition interval (pitch) "p" of the electrode fingers 32 configuring the IDT electrode 31 explained later. A planar shape and various dimensions of the first substrate 10 may be suitably set as well. Note that, an X-axis of the crystal of the LT substrate and the direction of propagation of the surface acoustic wave (SAW) substantially coincide.

The second substrate 20 is provided with a strength strong enough to support the first substrate 10. So far as the conditions which will be explained later are satisfied (see FIG. 5), the material thereof is not particularly restricted. The second substrate 20 may be formed also by a material having a smaller thermal expansion coefficient than the material for the first substrate 10. In this example, it is formed by silicon (Si). By using such a material, when the temperature changes, thermal stress is generated in the first substrate 10. At this time, the temperature dependency and the stress dependency of the elastic constant of the first substrate 10 are cancelled out by each other, and consequently the change of the electrical characteristics of the acoustic wave element (SAW element) due to the temperature is reduced (temperature compensation). In the present disclosure, as the second substrate 20, use is made of a single crystal Si. The crystal orientation etc. of Si will be explained later.

The thickness of the second substrate 20 is for example constant and may be suitably set. However, the thickness of the second substrate 20 is set considering the thickness of the first substrate 10 so that the temperature characteristic is suitably compensated. Further, the thickness of the first substrate 10 in the present disclosure is very small, therefore the second substrate 20 is made a thickness great enough to support the first substrate 10. As an example, it may be made 10 times or more the thickness of the first substrate 10. The thickness of the second substrate 20 is 50 to 600 µm. The planar shape and various dimensions of the second substrate 20 may be made equal to those of the first substrate 10, or the first substrate 10 may be smaller.

Further, for the purposes of improving the strength of the entire substrate, preventing warping due to the thermal stress, and supplying a stronger thermal stress to the first substrate 10, a not shown third substrate having a larger thermal expansion coefficient than the second substrate 20 may be bonded to the surface of the second substrate 20 which is opposite to the first substrate 10 as well. For the third substrate, when the second substrate 20 is comprised of Si, use can be made of a ceramic substrate, Cu layer, resin board, and the like. Further, when the third substrate is provided, the thickness of the second substrate 20 may be made small as well.

The first substrate 10 and the second substrate 20 may be bonded by so-called direct bonding activating the bonding surfaces by plasma, an ion gun, neutron gun, or the like, then bonding the two without a bonding layer. In other words, the bonding surfaces of the first substrate 10 and the second substrate 20 are provided with a flatness capable of direct bonding. In general, an arithmetic average roughness of a bonding surface capable of direct bonding is less than 5 nm. By bonding substrates having such bonding surfaces to each other, unlike ones bonded through a so-called bonding layer such as a resin or metal or the like, the crystal planes of the two substrates come into contact with each other, therefore the acoustic boundary becomes clear.

Further, there is no resin, adhesive, or the like functioning as the bonding layer present between the first substrate 10 and the second substrate 20, therefore formation of an unintended parasitic capacitance is suppressed and it becomes possible to disperse heat generated on the upper surface of the first substrate 10 to the side of the second substrate 20 well. Note that, so far as the effects explained in the following description can be obtained, a natural oxidation film, a protective film for preventing diffusion, various types of intermediate layers, a modified layer, or the like may be formed on the surfaces of the two substrates on the sides where the two are bonded.

Figure 2:
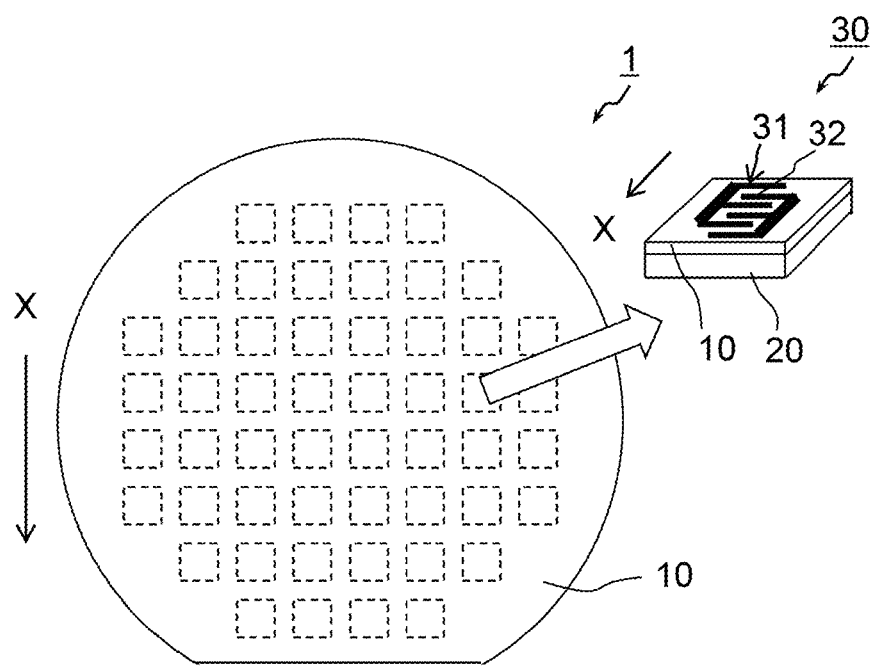
FIG. 2 is an explanatory diagram of a SAW element according to the present disclosure.

The composite substrate 1 is divided into a plurality of sections as shown in FIG. 2. Each section becomes a SAW element 30. Specifically, the composite substrate 1 is cut into each section thereby forming the SAW elements 30. In each SAW element 30, an IDT electrode 31 exciting the SAW is formed on the upper surface of the first substrate 10. The IDT electrode 31 has pluralities of electrode fingers 32, and the SAW is propagated along the direction of arrangement thereof. Here, this direction of arrangement is substantially parallel to the X-axis (below, sometimes referred to as the $X_{LT}$) of the piezoelectric crystal of the first substrate 10.

Here, by using the composite substrate 1, the SAW element 30 can suppress a change in the frequency characteristic (electrical characteristic) due to a temperature change.

Further, the first substrate 10 is thin, and the second substrate 20 is bonded. Due to this, in the SAW element 30, a bulk wave is reflected at the lower surface of the first substrate 10 and is input again to the IDT electrode 31, whereby a ripple referred to as a "bulk wave spurious resonance" is generated in a specific frequency. The bulk wave spurious resonance becomes conspicuous particularly in a case where the acoustic velocity of the second substrate 20 is faster than the acoustic velocity of the SAW propagating in the first substrate 10 (case where the first substrate 10 is made of LT or $LiNbO_3$ or the like and the second substrate 20 is made of sapphire or Si). This is because the bulk wave is sealed inside in the first substrate 10 due to a difference of acoustic velocities, the first substrate 10 operates as if it were a waveguide propagating the bulk wave, and that bulk wave and the IDT electrode 31 are coupled at a specific frequency.

Figure 3:
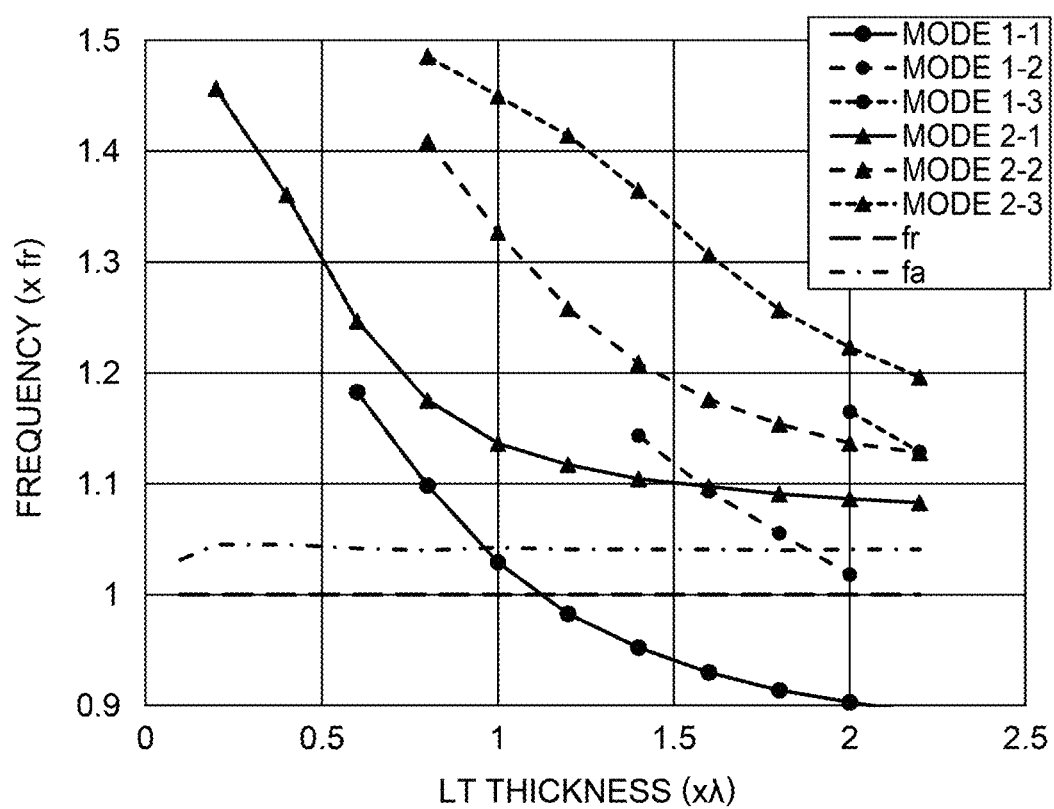
FIG. 3 is a graph showing relationships between a thickness of a first substrate and a frequency of occurrence of bulk wave spurious resonance.

Results of simulations of the relationships between the frequency at which this bulk wave spurious resonance is generated and the thickness of the first substrate 10 will be shown in FIG. 3. In FIG. 3, an ordinate shows a standardized frequency (unit: none) obtained by standardizing a resonance frequency, and an abscissa shows the thickness of the first substrate 10 in terms of wavelength ratio (unit:none). The simulations were carried out by the following parameters.

First substrate 10: LT, 42° Y-cut, X-propagated
Pitch "p" of IDT electrodes: 1 µm (λ=2 µm)
Material for electrode: Al (thickness: 0.08λ)
Second substrate 20: Si, plane orientation (111)

Note that, the simulations were carried out with the dimensions described above. However, in FIG. 3, standardized values are plotted on both of the ordinate and abscissa. Accordingly, the relationships in FIG. 3 can be applied to the case of any λ. Further, Si was used for forming the second substrate 20. However, almost the same results are obtained so long as the acoustic velocity in the second substrate 20 is faster than the acoustic velocity of the SAW propagating in the first substrate 10.

As apparent also from FIG. 3, while bulk wave spurious resonances of various modes and various degrees are generated, it is possible to confirm that the bulk wave spurious resonances appearing at the lowest frequency shift to a higher frequency side as a whole as the thickness of the first substrate 10 is made smaller. Note that, the modes 1 and 2 are spurious transmissions which are respectively caused by a slow transverse wave and a fast transverse wave. The numbers following "-" indicate numbering from the lowest generation frequency for the spurious transmissions respectively caused by the two types of waves. The mode 1-1 and mode 2-1 indicate bulk wave spurious resonances which respectively appear at the lowest frequencies of the spurious transmissions caused by the slow transverse wave and the fast transverse wave. Further, when the thickness of the first substrate 10 is made less than 1λ, it is possible to suppress manifestation of bulk wave spurious resonance in the vicinity of the resonance frequency which is generally demanded from the SAW element 30. Further, when the thickness of the first substrate 10 is made less than 0.8λ, manifestation of bulk wave spurious resonance in the vicinities of both of the resonance frequency and antiresonance frequency can be suppressed. Due to this, a SAW element 30 suppressing the influence of bulk wave spurious resonance can be provided.

Further, when the thickness of the first substrate 10 is made 0.2λ to 0.6λ, no bulk wave spurious resonance is generated up to a further higher frequency band, therefore a SAW element 30 provided with excellent electrical characteristics can be provided. Note that, when the thickness of the first substrate 10 is smaller than 0.2λ, the behavior as a resonator changes as shown in FIG. 3. Specifically, a difference between the resonance frequency fr and the antiresonance frequency fa (frequency difference fa−fr) becomes smaller. For this reason, in order to obtain a stable frequency characteristic, the thickness of the first substrate 10 may be set to 0.2λ or more as well.

Note that, a SAW element 30 reduced in the thickness of the first substrate 10 is for example disclosed in Japanese Patent Publication No. 2004-282232, Japanese Patent Publication No. 2015-73331, and Japanese Patent Publication No. 2015-92782.

Figure 4A:
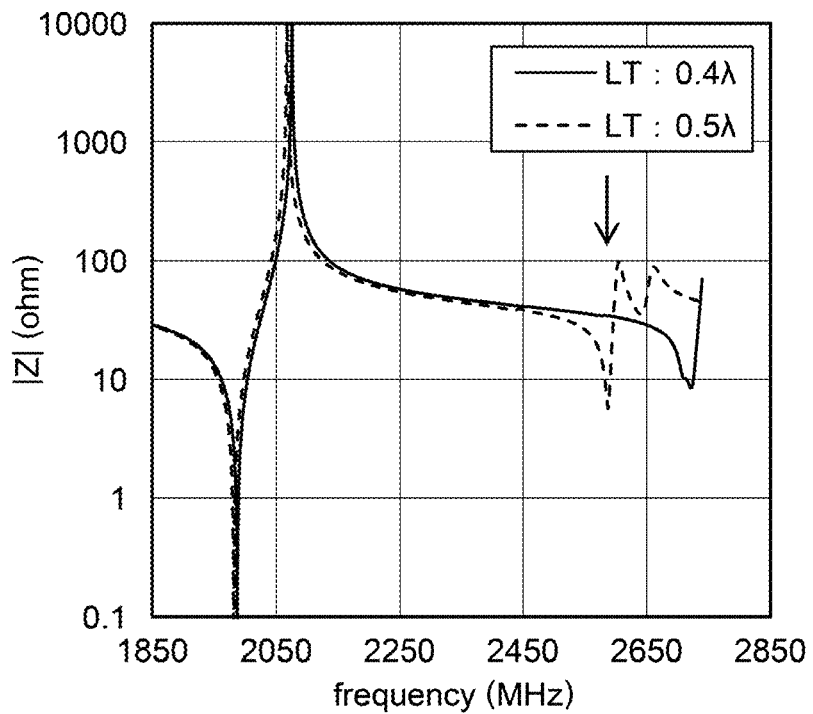
FIG. 4A is a graph showing frequency characteristics of SAW elements shown in FIG. 2.
Figure 4B:
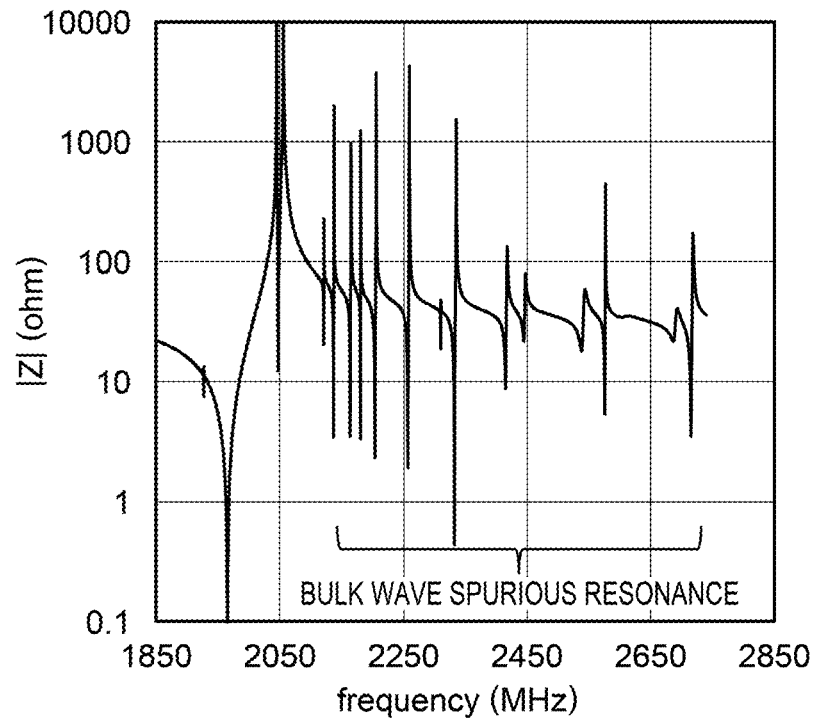
FIG. 4B is a graph showing a frequency characteristic of a conventional SAW element.

FIGS. 4A and 4B shows the resonator characteristics of the SAW element 30 when making the thickness of the first substrate 10 0.4λ and 0.5λ. Note that, as the second substrate 20, use was made of a substrate made of an Si single crystal and having a plane orientation of (111). The Euler angles notation (φ, θ, ψ) of this crystal plane is (−45, −54.7, 0). Further, for comparison, FIG. 4B shows the resonator characteristic in a case where the thickness of the first substrate 10 is made 5λ. Note that, a thickness such as 5λ is a thickness usually used in a bonded substrate used in a SAW element.

As apparent also from FIG. 4, according to the SAW element 30, the frequency of the bulk wave spurious resonance can be shifted to a high frequency side. As a result, in addition to the frequency bands in the vicinities of the resonance frequency and antiresonance frequency, there is no longer any bulk wave spurious resonance in a broad frequency range on a higher frequency side than the antiresonance frequency, therefore a SAW element 30 having little loss and excellent in electrical characteristics can be provided. Note that, in FIG. 4A, the bulk wave spurious resonance is indicated by an arrow.

In this way, by making the thickness of the first substrate 10 thinner, a SAW element 30 excellent in electrical characteristics can be provided. However, on the other hand, the thickness of the first substrate 10 is smaller than the wavelength, therefore part of the vibration of the SAW reaches the second substrate 20 as well. For this reason, the SAW element 30 is influenced by the material for the second substrate 20 and influenced by the thickness of the first substrate 10.

<Definition of Material for Second Substrate Suppressing Rate of Change of Frequency>

In the SAW element 30 used in FIG. 4A as well it can be confirmed that the resonance frequency and the antiresonance frequency differ somewhat between the case where the thickness of the first substrate 10 is 0.4λ and the case where it is 0.5λ. That is, it is confirmed that the electrical characteristics changed according to the change of the thickness of the first substrate 10. This shows that the frequency characteristic varies according to variation of the thickness of the first substrate 10. The first substrate 10 is formed by polishing the single crystal substrate or forming a film by a thin film formation process. For this reason, in an actual manufacturing process, variation of the thickness is unavoidable. Therefore, in order to realize a stable frequency characteristic as the SAW element 30, it is necessary to raise a robustness with respect to the thickness of the first substrate 10.

Specifically, it is necessary to make the rate of change of frequency relative to the change of the thickness of the first substrate 10 lower. Here, the rate of change of frequency is defined by finding absolute values of ratios of change of the resonance frequency and antiresonance frequency when the thickness of the first substrate 10 changes and finding a mean value of them. Further, the rate of change of frequency is represented by the following equation:

$$(\Delta f/f)/(\Delta t/t)=(|(\Delta fr/fr)/(\Delta t/t)|+|(\Delta fa/fa)/(\Delta t/t)|)/2$$

Where, "f" designates the frequency, fr the resonance frequency, fa the antiresonance frequency, and "t" the thickness of the first substrate 10. Further, Δ indicates the amount of change thereof. The unit of the rate of change of frequency is dimensionless. However, for easy understanding, it will be indicated as %/%. When this rate of change of frequency is small, the SAW element becomes higher in robustness.

Figure 5:
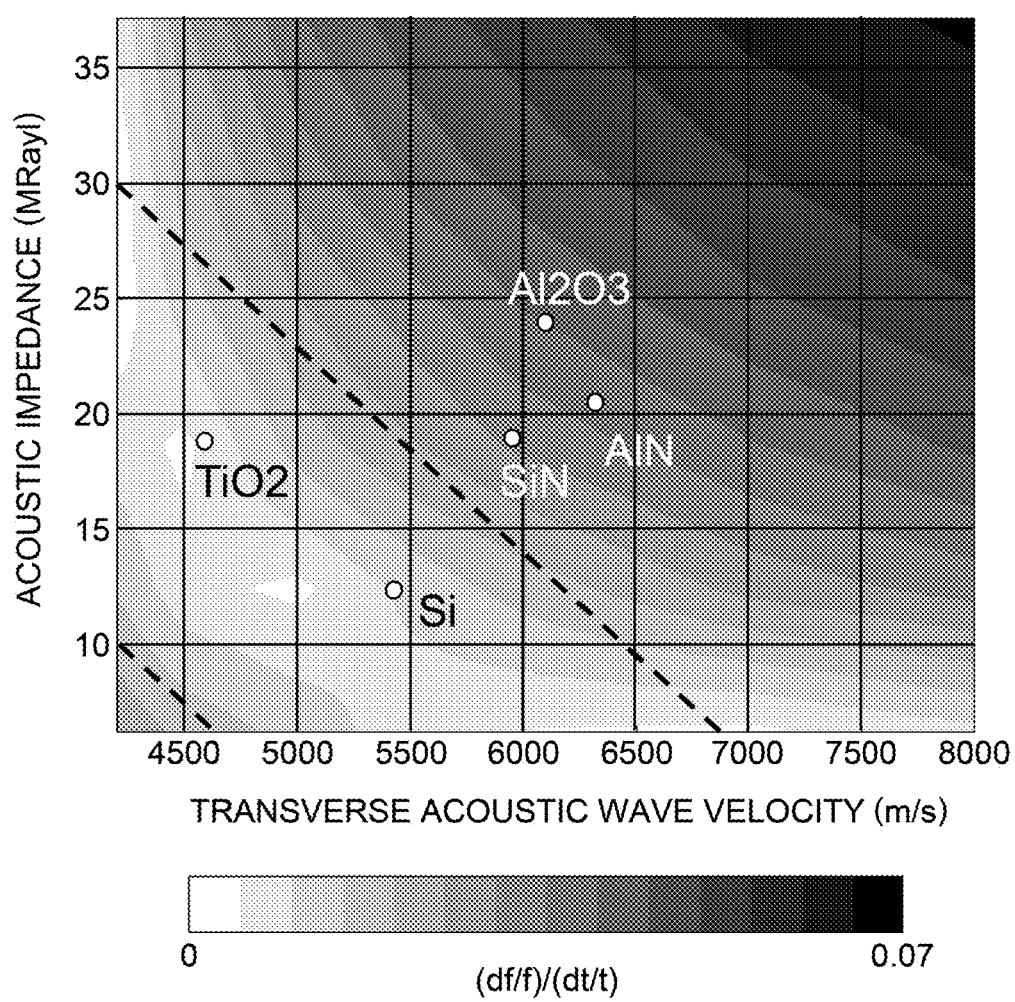
FIG. 5 is a contour map showing a correlation between a material parameter of a second substrate and a rate of change of frequency of the frequency characteristic of the SAW element.

The results of simulations of such a rate of change of frequency by changing the material parameters of the second substrate 20 will be shown in FIG. 5. In FIG. 5, an abscissa shows the acoustic velocity V (unit: m/s) of the transverse bulk wave propagating in the second substrate 20, and an ordinate shows the acoustic impedance I (unit: MRayl) of the second substrate 20. This shows a contour map of the rate of change of frequency.

As apparent also from FIG. 5, when the second substrate 20 satisfies specific material parameters, the rate of change of frequency can be made low. Specifically, when the acoustic impedance I (unit: MRayl) of the material configuring the second substrate 20 and the acoustic velocity V (unit: m/s) of the transverse wave satisfy the relationship of the following Equation (1), the rate of change of frequency can be made low.

$$-0.0085 \times V+45.75 \leq I \leq -0.0085 \times V+65.75 \quad \text{Equation (1)}$$

The range satisfying Equation (1) is a region sandwiched between the two broken lines shown in FIG. 5.

Note that, when the acoustic velocity V of the transverse bulk wave propagating in the second substrate 20 becomes the same degree or less of the acoustic velocity of SAW propagating in the piezoelectric substrate, a spurious transmission is generated in the resonance characteristic or the acoustic wave leaks to the second substrate 20 side so that the loss becomes larger. For this reason, preferably V is schematically 4400 m/s or more. Further, when the acoustic impedance I becomes too small, the effect of the second substrate 20 becomes small, therefore the rate of change of frequency becomes large. For this reason, I is desirably 5 MRayl or more.

As a material satisfying such relationships, Si and $TiO_2$ can be exemplified. The conditions of the materials which are preferred as the second substrate 20 are the same also for SAW elements 30A and 30B which will be explained later.

<Plane Orientation and Propagation Angle of Second Substrate (Si)>

Note that, even in the same material, the value of the rate of change of frequency sometimes changes due to the difference of crystal orientation etc. Therefore, the rates of change of frequency when making the plane orientation and the rotation angle (ψ propagation angle) relative to the X-axis ($X_{LT}$) of the first substrate 10 different when using an Si single crystal substrate as the second substrate 20 were simulated.

Here, the meaning of the propagation angle ψ in a certain plane orientation of a crystal will be explained.

Figure 6:
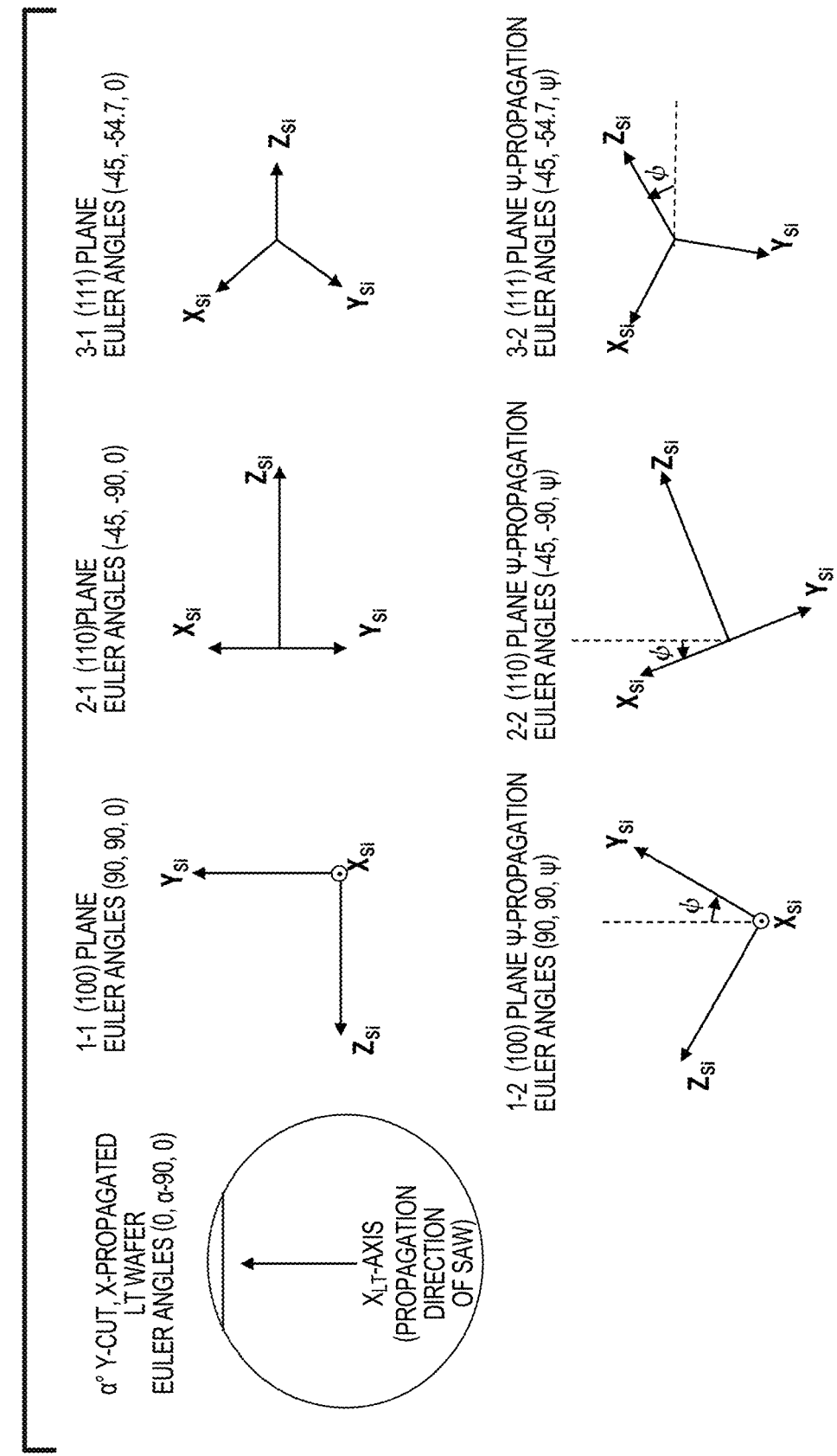
FIG. 6 is a view for explaining crystal axes of the second substrate.

FIG. 6 illustrates the plane orientations of the Si single crystal and their Euler angles notations and propagation angles ψ. The inclination angle between the X-axis of the first substrate 10 (direction of propagation of SAW, $X_{LT}$) and the Si crystal axis will be explained. When the (100) plane of the Si single crystal is indicated by Euler angles notation, it becomes (90, 90, ψ). In the same way, the (110) plane becomes (−45, −90, ψ), and the (111) plane becomes (−45, −54.7, ψ). At the time of ψ=0, the relationships between the crystal axes $X_{Si}$, $Y_{Si}$, and $Z_{Si}$ of Si provided with such plane orientations and the $X_{LT}$ of the first substrate 10 are shown at the upper row (1-1, 2-1, 3-1) in FIG. 6. Note that, FIG. 6 shows the orientations of crystal axes when viewing the first substrate 10 and second substrate 20 from the upper surfaces. The axes which are shown long follow along the surface of the substrate, while the axes which are shown short are inclined relative to the substrate surface. It is assumed that the first substrate 10 and the second substrate 20 are bonded so that they are superposed on each other as they are as shown in the view of the wafer shown at the left end in the upper row in FIG. 6.

Further, from the state in the upper row in FIG. 6, the Si crystal (crystal configuring the second substrate 20) is rotated about the normal vector on the upper surface of that substrate by ψ. In other words, the crystal axis parallel to the upper surface of the substrate is rotated in the plane direction. Note that, the first substrate 10 and the second substrate 20 are superposed on each other, therefore the normal vectors of the upper surfaces of the two substrates coincide. The Euler angles notations at that time become as follows:

(100) plane ψ rotation: (90, 90, ψ)
(110) plane ψ rotation: (−45, −90, ψ)
(111) plane ψ rotation: (−45, −54.7, ψ)

The relationships after such rotation between the crystal axes $X_{Si}$, $Y_{Si}$, and $Z_{Si}$ of the Si crystal and the X-axes ($X_{LT}$) of the first substrate 10 are shown in the lower stage (1-2, 2-2, 3-2) in FIG. 6. The X-axes is of piezoelectric crystal of the first substrate 10 is the vertical direction of the figure. In this way, the case of ψ rotation will be referred to as the "ψ propagation angle" of a certain plane orientation. Note that, Si is a cubic crystal, therefore the crystal axes $X_{Si}$, $Y_{Si}$, and $Z_{Si}$ are equal, so the argument in the present disclosure stands in all equal directions obtained by replacing the $X_{Si}$, $Y_{Si}$, and $Z_{Si}$ axes with each other.

Figure 7A:
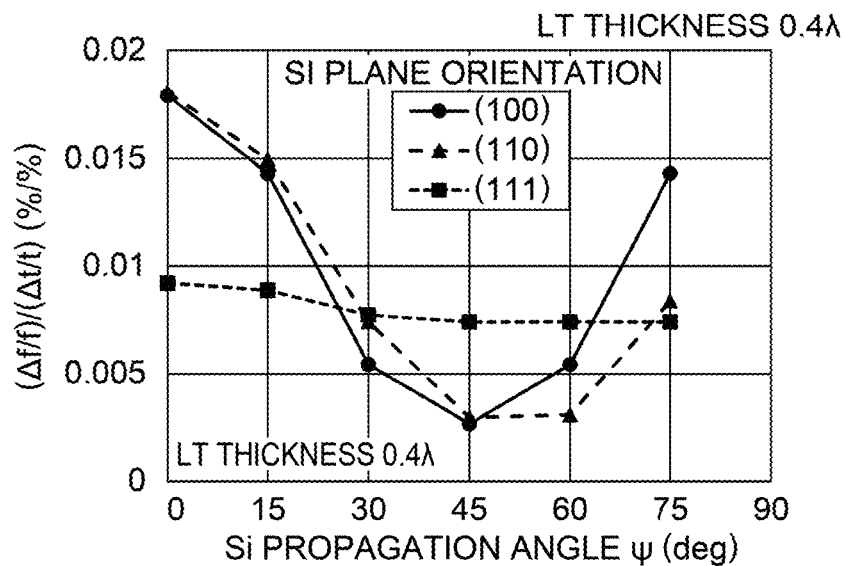
FIGS. 7A to 7C respectively show rates of change of frequency when making the crystal plane and the φ propagation angle different.
Figure 7B:
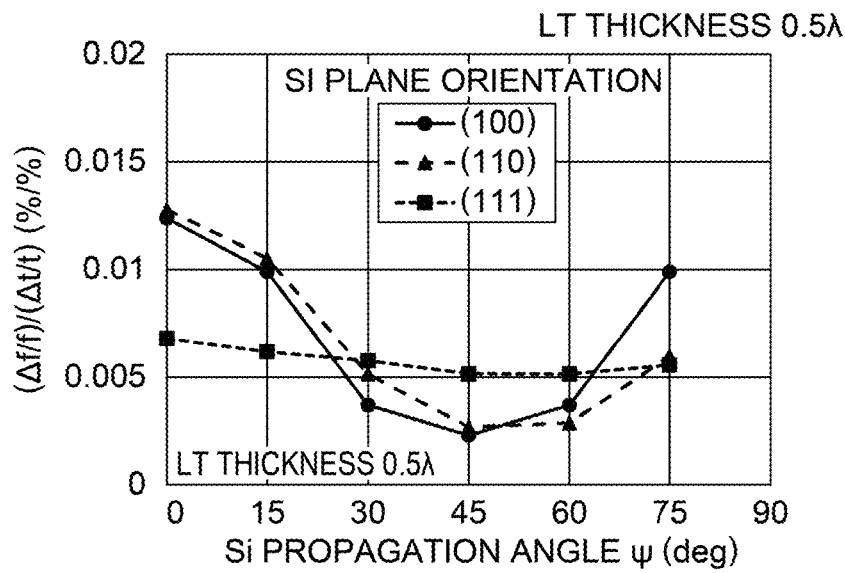
Figure 7C:
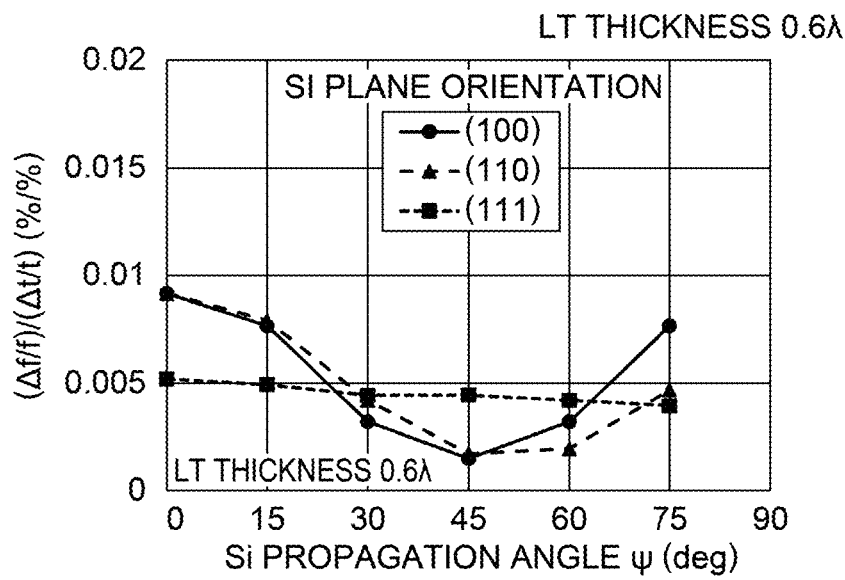

Here, the results of simulation of the rate of change of frequency of the SAW element when changing ψ for each plane orientation will be shown in FIGS. 7A to 7C. In FIGS. 7A to 7C, the abscissas show the propagation angle ψ (unit: deg), and the ordinates show the rate of change of frequency. Further, FIGS. 7A to 7C respectively show the results of simulation when the thicknesses of the first substrate 10 are made 0.4λ, 0.5λ, and 0.6λ.

The generally used Si single crystal wafer has a plane orientation (111) and an orientation flat (110). When this is bonded to a generally used LT substrate (orientation flat direction [100], cut so that the orientation flat becomes vertical to $X_{LT}$ as shown in FIG. 6) so that the orientation flats are aligned, an Si (111) plane 0°-propagating part is obtained.

As apparent from this view, when using the (100) plane and (110) plane and making the ψ propagation angle a range of 45°±20°, the rate of change of frequency can be kept small compared with a general crystal plane. Further, when the range is made 45°±15°, the rate of change of frequency can be controlled to less than 0.005%/%, therefore a SAW element 30 having a further smaller rate of change of frequency and able to exhibit stable electrical characteristics can be provided.

Here, variations of the frequency characteristics due to the ψ propagation angles as shown in FIGS. 7A to 7C occur by a cycle of 90° or 180°. For this reason, the propagation angle which is equal to the case where the ψ propagation angle is made the range of 45°±20° becomes 25° to 65°, 115° to 155°, 205° to 254°, and 295° to 345°.

Note that, when bonding with an LT wafer which is generally used as described above while aligning the orientation flat directions, in the case of a plane orientation (100) and propagation angle of 45°, use may be made of an Si wafer having a plane orientation of (100) and orientation flat direction of (110) or its equal orientation, further, in the case of a plane orientation (110) and propagation angle of 45°, use may be made of an Si wafer having a plane orientation of (110) and orientation flat direction obtained inclined by 45° from (100) and its equal orientation.

Further, as apparent from FIGS. 7A to 7C, the greater the thickness of the first substrate 10, the smaller the rate of change of frequency. From the viewpoint of the bulk wave spurious resonance, the smaller the thickness of the first substrate 10, the higher the generation frequency and the broader the frequency band without bulk wave spurious resonance. However, from the viewpoint of reducing the rate of change of frequency, preferably the thickness is made greater. From the above description, the thickness of the first substrate 10 may be made 0.4λ to 0.6λ enabling the effects of the two to be exhibited.

Figure 8A:
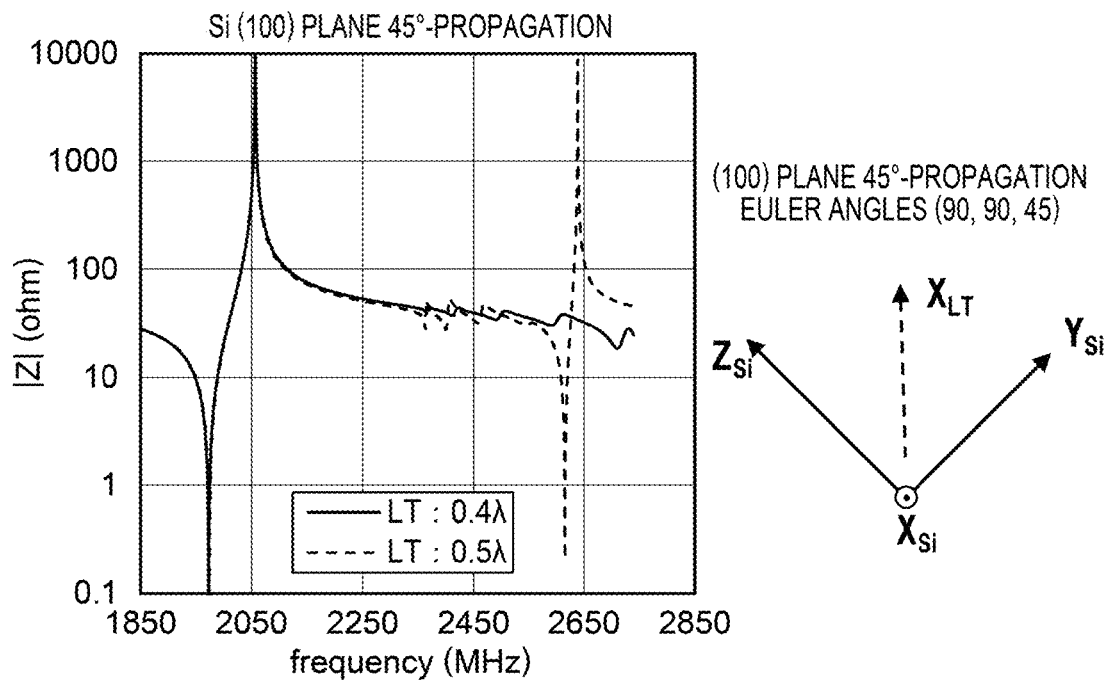
FIGS. 8A and 8B are graphs showing the frequency characteristics of SAW elements.
Figure 8B:
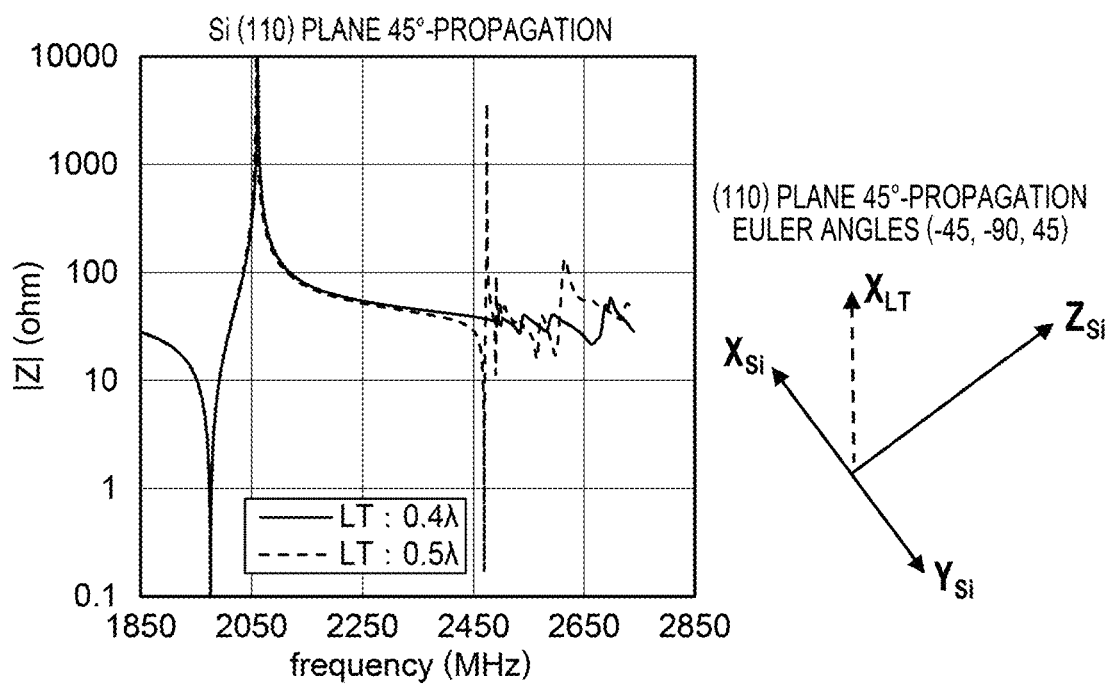

The frequency characteristic of such a SAW element 30 will be shown in FIGS. 8A and 8B. In FIGS. 8A and 8B, the abscissas show the frequency (unit: MHz), and the ordinates show the absolute value of impedance (unit: ohm). These show the frequency characteristics at the time when the thickness of the first substrate 10 is made 0.4λ and the time when it is made 0.5λ. The characteristics at the time of the thickness 0.4λ are indicated by solid lines, and the characteristics at the time of the thickness 0.5λ are indicated by broken lines. Note that, in FIG. 8A, use was made of the 45°-propagation part while making the plane orientation of the second substrate 20 the (100) plane. In the same way, in FIG. 8B, use was made of the 45°-propagation part while making the plane orientation of the second substrate 20 the (110) plane. The relationships of the crystal axes will be shown on the right side in the graphs.

As apparent from FIGS. 8A and 8B, according to the SAW element 30, even if the thickness of the first substrate 10 varies, there is no variation in any of the resonance frequency, antiresonance frequency, and difference between the resonance frequency and the antiresonance frequency, therefore it was confirmed that a change of the frequency characteristics could be suppressed. In particular, as apparent also from comparison between FIG. 4A and FIGS. 8A and 8B, when the crystal orientation and propagation angle of the second substrate 20 are made the ranges explained above, a change of frequency can be suppressed.

As described above, when making the thickness of the first substrate 10 less than 1λ and using a material satisfying the relationship of Equation (1) for forming the second substrate 20, a SAW element 30 which is excellent in electrical characteristics and has a high reliability can be provided. In particular, when the second substrate 20 is made by using an Si single crystal with a crystal plane having a plane orientation of (100) or (110) and inclined by 25° to 65° about the normal line of the upper surface of the second substrate 20, a SAW element 30 having a further higher reliability can be provided.

Further, the first substrate 10 and the second substrate 20 are directly bonded, therefore generation of unintended capacity is suppressed, and the heat generated on the side of the first substrate 10 can be transferred to the second substrate 20 well. From this fact, a SAW element 30 having a high reliability can be provided.

Further, the first substrate 10 and the second substrate 20 are directly bonded, therefore segregation of unintended impurities on the bonding interface or diffusion to the side of the second substrate 20 can be suppressed. In the SAW element 30 in the present disclosure, the first substrate 10 is small in thickness, so is influenced by the second substrate 20. Therefore, preferably a change of the characteristics of the second substrate 20 due to such diffusion of impurities is prevented.

<Relationship with Bulk Wave Spurious Resonance Strength>

In the example explained above, the propagation angle of the second substrate 20 was set from the viewpoint of the rate of change of frequency. However, the propagation angle may be set from the viewpoint of the strength of the bulk wave spurious resonance as well. By employing the configuration explained above, there is no bulk wave spurious resonance in the vicinities of the resonance frequency and antiresonance frequency. However, a bulk wave spurious resonance is generated on a higher frequency side as indicated by the arrow in FIG. 4A. As a result of repeated intensive studies by the inventors, it was found that the strength of the spurious transmission could be suppressed by making the relationships between the thickness of the first substrate 10 and the Euler angles of the second substrate 20 a certain relationships.

Figure 25:
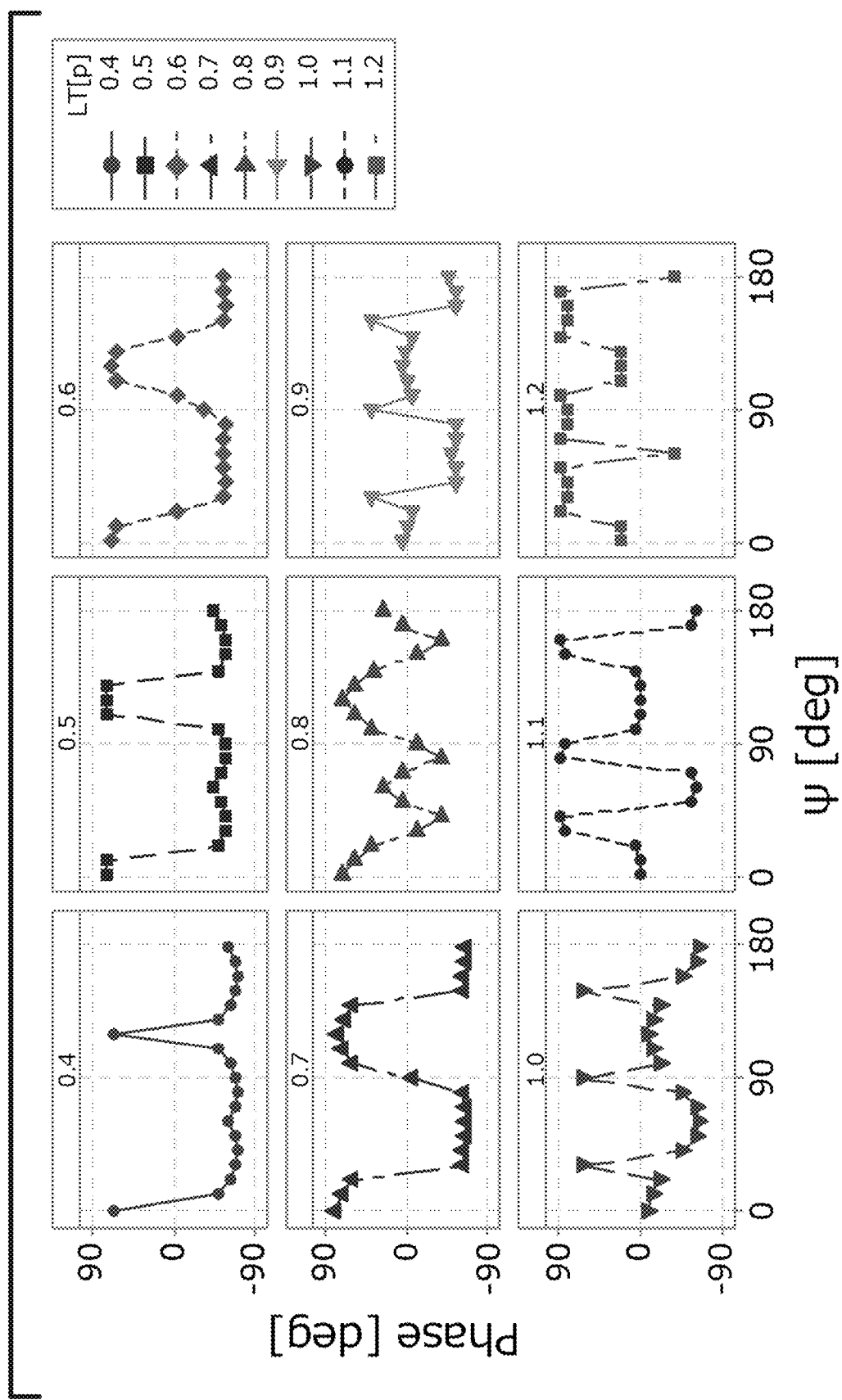
FIG. 25 illustrates graphs calculating a correlation among the thickness of the first substrate, the propagation angle of the second substrate, and the maximum phase value of a bulk wave spurious resonance in the SAW element 30.

FIG. 25 shows situations of changes of the maximum phase value of the impedance of the bulk wave spurious resonance when changing the thickness of the first substrate 10 and the propagation angle $\psi$ of the second substrate 20 by using the Si-(111) plane as the second substrate 20. The thickness of the first substrate 10 was changed from 0.4p to 1.2p (that is, 0.2λ to 0.6λ) relative to the pitch "p". In FIG. 25, the abscissas show the propagation angles (deg) of the second substrate 20, and the ordinates show the maximum phases (deg) of the bulk wave spurious resonance. The number on the top in each of the graphs indicates the value of the wavelength ratio of the thickness of the first substrate 10.

As apparent from FIG. 25, it could be confirmed that the maximum phase value greatly varied according to the propagation angle and that the variation repeated by a cycle of 120°. Further, it could be confirmed that the maximum phase value also greatly varied according to the thickness of the first substrate 10, the range of the propagation angle where the maximum phase value was small became narrower along with an increase of the thickness, and there was almost no region where the spurious transmission became small when the thickness was 1.2 p or more (0.6λ or more).

Based on the above results, the relational equations between the propagation angle and the thickness D of the first substrate 10 giving a maximum phase value of −50 deg or less were derived. Specifically, when simultaneously satisfying the following equations, the bulk wave spurious resonance strength can be suppressed.

$$43.49 \times D + 0.55 \leq \psi \leq -44.86 \times D + 119.04$$

$$0.4p \leq D \leq 1.1p$$

Note that, even at the propagation angle of $\psi + 120 \times \alpha$, the bulk wave spurious resonance strength can be suppressed in the same way.

Here, $\alpha$ is 0, 1, or 2.

Although the cause is not clear, when the thickness of the first substrate 10 was 0.8 p, the maximum phase value tended to become larger. Therefore, more preferably, in the relational equations explained above, if the range of thickness of 0.7 p<D<0.9 p is excluded, the bulk wave spurious resonance can be suppressed more stably.

Figure 26:
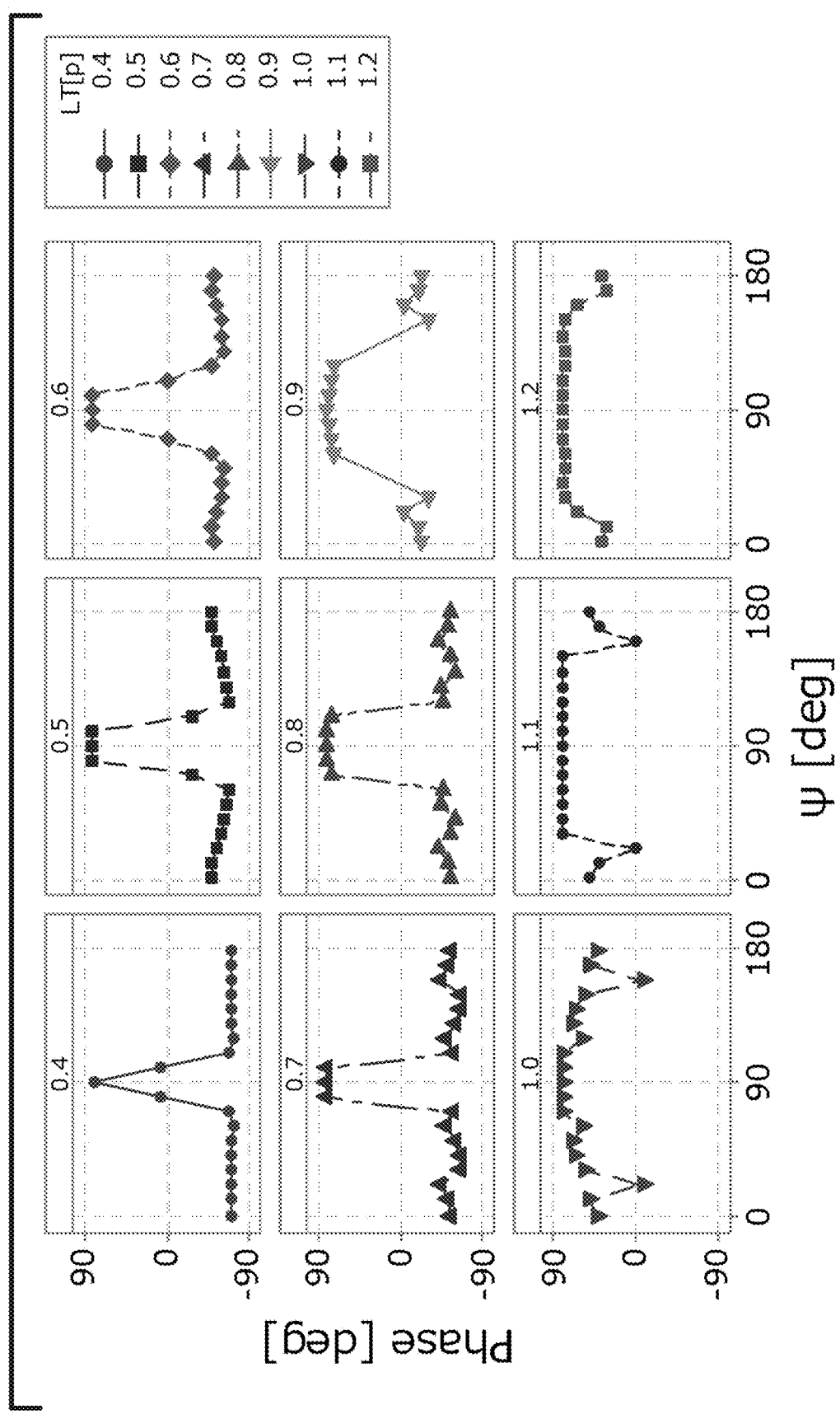
FIG. 26 illustrates graphs calculating a correlation among the thickness of the first substrate, the propagation angle of the second substrate, and the maximum phase value of a bulk wave spurious resonance in the SAW element 30.

In the same way, the results of studies for the case where use was made of Si (110) as the second substrate 20 will be shown in FIG. 26. As apparent from FIG. 26, it could be confirmed that the maximum phase value greatly varied according to the propagation angle and that the variation repeated by a cycle of 180°. Further, it could be confirmed that the maximum phase value greatly varied also according to the thickness of the first substrate 10, there was no variation in the range of propagation angle where the maximum phase value was small with respect to the increase of the thickness, but there was almost no region where the spurious transmission became small when the thickness was 0.9 p or more (0.45λ or more).

Based on the above results, the relationship between the propagation angle and the thickness D of the first substrate 10 giving a maximum phase value of −50 deg or less was derived. Specifically, when simultaneously satisfying the following equations, the bulk wave spurious resonance strength can be suppressed:

$$-60 \leq \psi \leq 60$$

$$0.4p \leq D \leq 0.8p$$

Note that, even at the propagation angle of $\psi + 180 \times \alpha$, the bulk wave spurious resonance strength can be suppressed in the same way. Here, $\alpha$ is 0 or 1.

Figure 27:
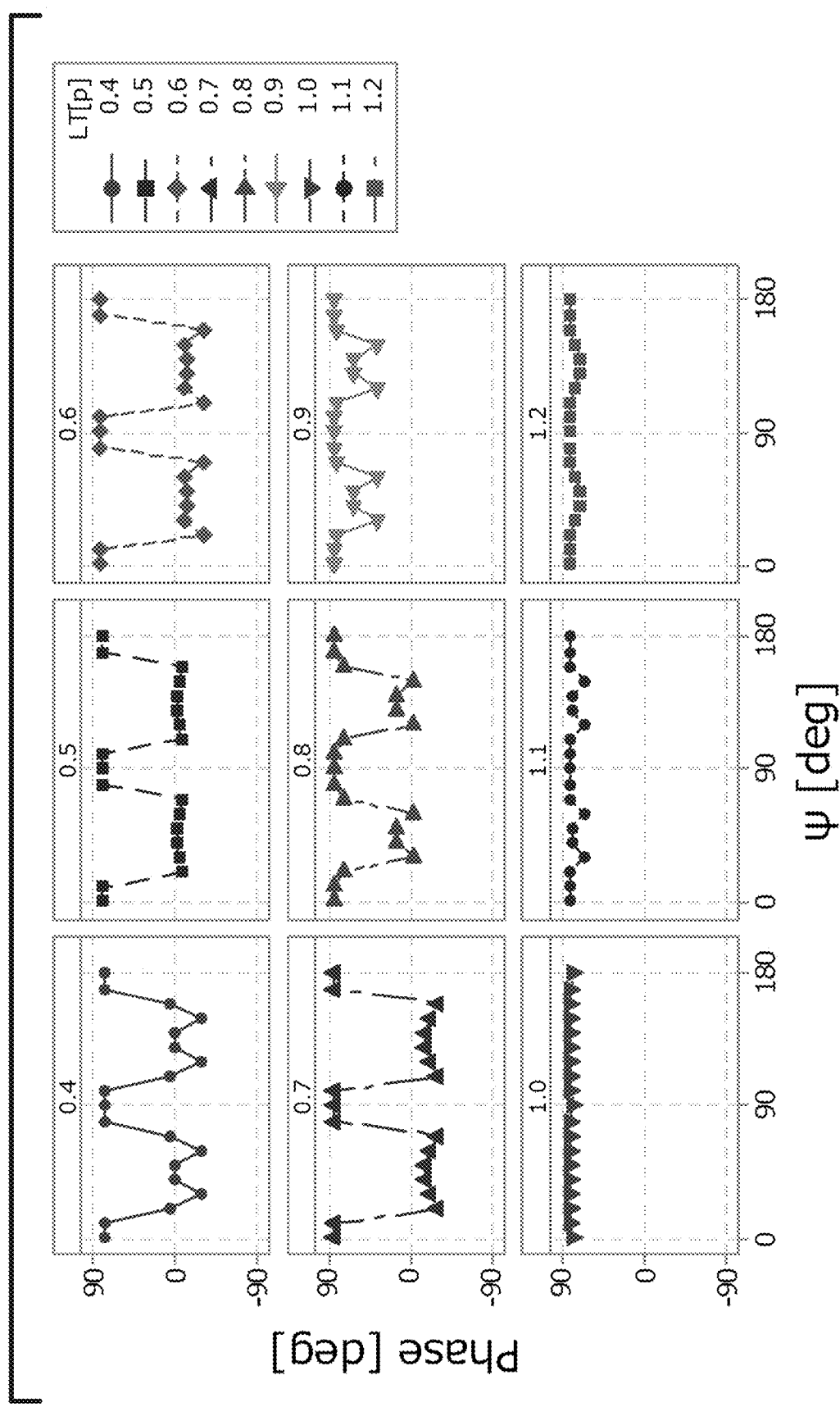
FIG. 27 illustrates graphs calculating a correlation among the thickness of the first substrate, the propagation angle of the second substrate, and the maximum phase value of a bulk wave spurious resonance in the SAW element 30.

Next, the results of the same studies for the case where use was made of Si (100) as the second substrate 20 will be shown in FIG. 27. As apparent from FIG. 27, it could be confirmed that the maximum phase value greatly varied according to the propagation angle and that the variation repeated by a cycle of 90°. Further, it could be confirmed that the maximum phase value greatly varied also according to the thickness of the first substrate 10, the range of the propagation angle where the maximum phase value was small became narrower along with an increase of the thickness, and there was almost no region where the spurious transmission became small when the thickness was 0.9 p or more (0.45λ or more). Further, compared with the other crystal orientations, the maximum phase value was large as a whole.

Based on the above results, the relationship between the propagation angle and the thickness of the first substrate 10 where the maximum phase value clearly became small compared with the value at the propagation angle of 90° was derived. Specifically, when simultaneously satisfying the following equations, the bulk wave spurious resonance strength can be suppressed:

$$20 \times D + 10 \leq \psi \leq -20 \times D + 80$$

$$0.4p \leq D \leq 0.8p$$

Note that, even at the propagation angle of $\psi + 90 \times \alpha$, the bulk wave spurious resonance strength can be suppressed in the same way. Here, $\alpha$ is 0, 1, 2, or 3.

Further, the range where the maximum phase value becomes −0 deg or less is as follows:

$$20 \leq \psi \leq 70$$

$$D \leq 0.7p$$

From the above results, by satisfying the following conditions, the bulk wave spurious resonance strength is suppressed, while the rate of change of frequency can be suppressed.

When using the Si-(111) plane as the second substrate 20, the thickness of the first substrate 10 may be made 0.5λ or more and $\psi$ may be made equal to 60°±5°. When the thickness of the first substrate 10 is made less than 0.4λ, the angle is set so that $\psi = 45° \pm 5°$ or $\psi = 65° \pm 5°$ stands.

When using the Si-(110) plane as the second substrate 20, the thickness of the first substrate 10 may be made 0.4λ or less and $\psi$ may be made equal to 30° to 60°. When the thickness of the first substrate 10 exceeds 0.4λ, $\psi$ is made equal to 25° to 30°.

When use is made of the Si-(100) plane as the second substrate 20, ψ is made equal to 30°±5° or 60°±5°. The thickness of the first substrate 10 may be made 0.45λ or less as well.

Note that, combinations of the thickness D of the first substrate 10 and the propagation angle of the second substrate 20 capable of suppressing bulk wave spurious resonance as shown in FIGS. 25 to 27 will be shown in FIG. 31.

(Modification of SAW Element 30)

In the example explained above, the resistivity of the second substrate 20 was not particularly restricted. However, the resistivity may be made 5000 Ω·cm or more as well. As explained above, the thickness of the first substrate 10 is small, therefore the frequency characteristic of the SAW element 30 is influenced by the second substrate 20. Therefore, among the characteristics of the second substrate 20, the resistivity was focused on. Specifically, the frequency characteristics of impedance of the SAW element 30 when making the resistivity different were simulated, and the maximum value of the phase of that impedance and the Q-value at the resonance frequency were derived. Note that, the maximum value of the phase of the impedance reflects the loss of the SAW element 30. As indicated, the closer to 90°, the smaller the loss. Further, also the Q-value is a value reflecting the loss. The results thereof will be shown in FIGS. 9A and 9B.

Figure 9A:
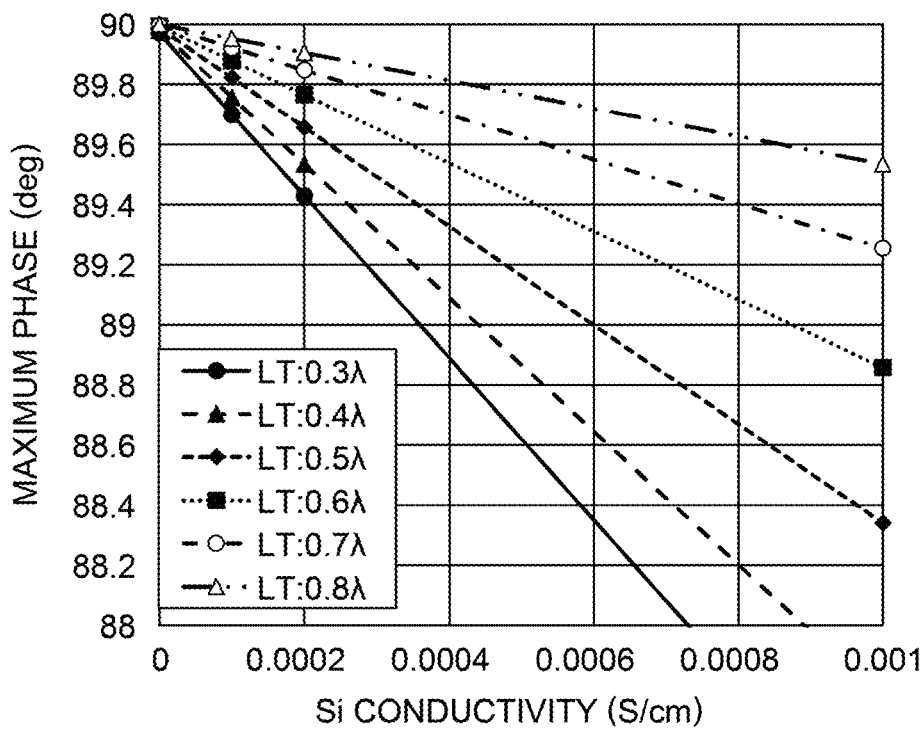
FIGS. 9A and 9B are graphs showing a correlation between a resistivity of the second substrate and the frequency characteristic of the SAW element.
Figure 9B:
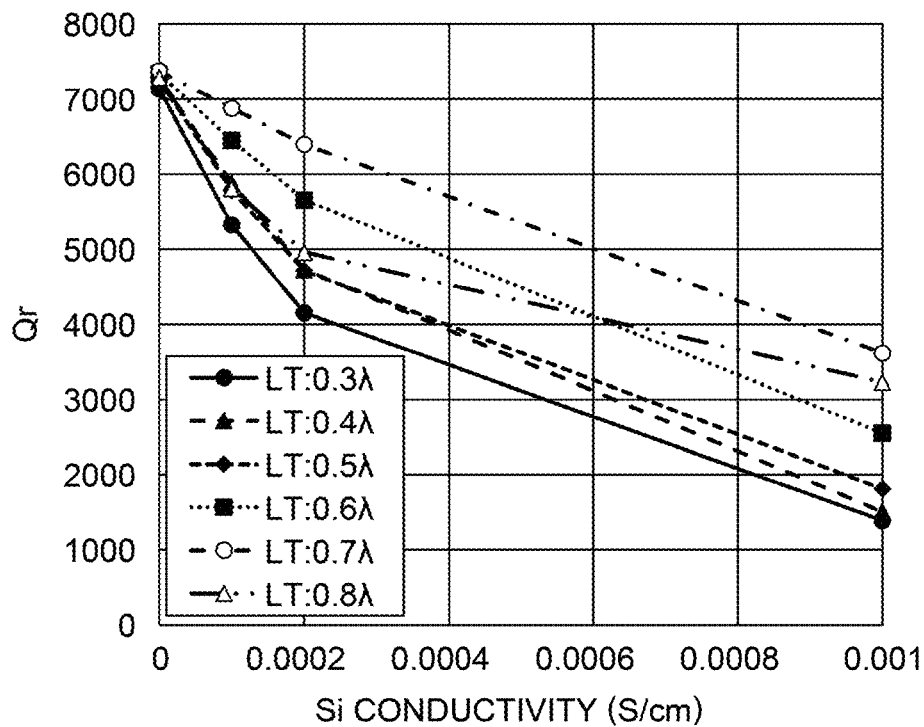

In FIGS. 9A and 9B, the conductivities (unit: S·cm-1) when forming the second substrate 20 by Si are shown on the abscissas, the maximum value (unit: deg) of the phase of the impedance is shown on the ordinate in FIG. 9A, and the Q-value (unit: none) at the resonance frequency is shown on the ordinate in FIG. 9B. The simulations were carried out while changing the thickness when forming the first substrate 10 by an LT substrate from 0.3λ to 0.8λ.

As apparent from FIGS. 9A and 9B, situations where the maximum phase and Q-value became smaller and the loss became larger as the thickness of the first substrate 10 became smaller were confirmed. Further, it was confirmed that the degree of the separation became smaller as the conductivity of the second substrate 20 was made lower. For example, if the conductivity is 0.0002 S/cm or less (resistivity: 5000 Ω·cm or more), even at the time when the thickness of the first substrate 10 is 0.4λ, the maximum phase can be controlled to a preferable value such as 89.5° or more and the Q-value can be controlled to a preferable value such as 5000Ω or more. From the above description, when the thickness of the first substrate 10 was made less than 0.8λ, the resistivity of the second substrate 20 may be set to 5000 Ω·cm or more as well.

When an Si single crystal substrate is used for forming the second substrate 20, it is necessary to reduce the amount of dopant in order to lower the conductivity (raise the resistivity). However, in a case where heat is added in a process of bonding the first substrate 10 and the second substrate 20 or process after bonding (for example process of forming IDT), the ingredients of the first substrate 10 diffuse as impurities in the Si single crystal substrate, so there is a possibility of rise of the conductivity of the Si single crystal substrate. In order to prevent this, SiNx, SiOx, or another diffusion prevention layer may be added to the side of the bonding surface of the Si single crystal substrate or first substrate 10.

Further, in order to lower the conductivity of the second substrate 20, an Si film may be formed on the Si single crystal substrate by a thin film forming method as well. In this case, it becomes possible to control the conductivity of the Si film by the film formation conditions. For example, when an epitaxial film is formed by epitaxial growth on the Si single crystal substrate, the feed gas may be adjusted. When a vapor deposition film is formed, the purity of the target and degree of vacuum in the chamber may be adjusted. The Si film formed by the vapor deposition process or the like may be different in crystallinity from the single crystal substrate or may be reconstructed to have the same crystallinity as that of the underlying layer single crystal substrate by heating after film formation. In this way, the resistivity may be partially raised only in a region continuing from the surface on the side bonded with the first substrate 10. In this case, sometimes the crystallinity partially changes in the region on the first substrate 10 side.

(Modification of SAW Element 30)

In the example explained above, the group of electrodes including the IDT electrodes 31 to be formed on the first substrate 10 were not particularly restricted. However, an insulation layer 35 may be provided between the electrodes except for the IDT electrodes 31 in the group of electrodes and the first substrate 10.

Figure 10:
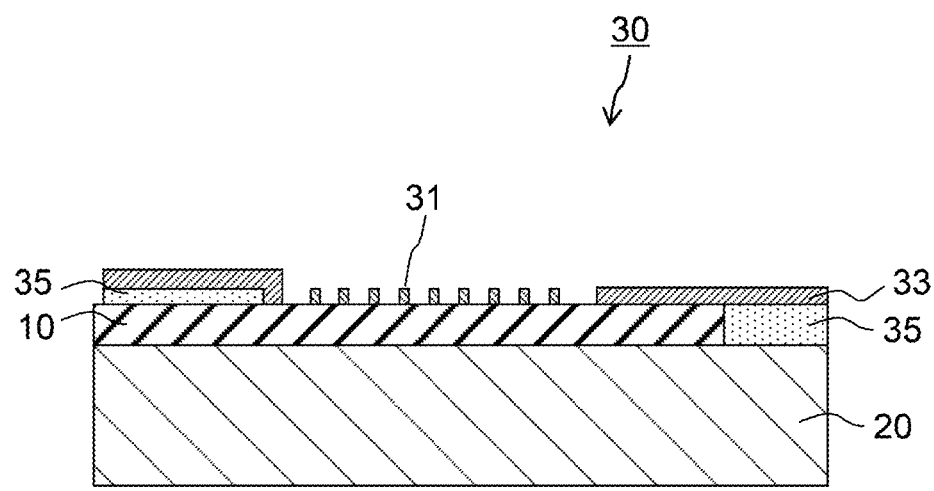
FIG. 10 is a cross-sectional view showing a modification of the SAW element shown in FIG. 2.

As explained above, when the thickness of the first substrate 10 becomes small, the magnetic field formed by current flowing through the wiring parts other than the IDT electrodes 31 and the electrical field formed by capacity components of the wiring parts together reach the second substrate 20. In that case, if the second substrate 20 has conductivity, there is a possibility that electrical loss is caused, electromagnetic coupling occurs between the electrodes so the parasitic capacitance increases, or the acoustic wave elements are coupled with each other so the electrical characteristics deteriorate. In order to prevent this, as shown in FIG. 10, the insulation layer 35 may be formed just under the wirings 33 other than the IDT electrodes 31 formed on the first substrate 10. Specifically, the insulation layer 35 is formed between terminal pads to/from a high frequency signal is input/output, wirings extending therefrom to the IDT electrodes 31 and/or wirings 33 electrically connecting IDT electrodes 31 to each other and the first substrate 10.

Due to the existence of such insulation layers 35, an effect equal to raising the resistivity of the second substrate 20 is exhibited, therefore the loss of the SAW element 30 as a whole can be reduced. As the insulation layer, a material having a smaller dielectric constant than the first substrate 10 is preferred. Polyimide or another resin material and SiOx, SiNx, or another inorganic material can be exemplified. When the dielectric constant of the insulation layer material is smaller than that of the first substrate 10, the electric field generated in the wirings 33 concentrates at the insulation layer 35 and has a harder time permeating the first substrate 10 and second substrate 20. For this reason, the adverse influence due to the conductivity of the second substrate 20 can be reduced.

The thickness demanded from the insulation layer 35 may be set so as not to cause a large level difference among the electrodes formed on that. Further, when the insulation layer is provided only for the electrode pads etc. and/or thick film wirings or other wirings 33 which are great in thickness, the thickness of the insulation layer 35 can be made relatively great. In the case of generally used thickness about 1 μm to 5 μm electrode pads and thick film wirings, if the end parts in the insulation layer 35 are tapered, a good connection is obtained even if the thickness is 2 to 20 μm. If the resonance frequency is about 1 GHz (λ is about 4 μm), the thickness of the first substrate 10 becomes about 2 μm (in a case where the thickness is 0.5λ). Therefore, if there is an insulation layer 35 having the thickness as described above, it becomes possible to substantially ignore permeation of the electric field from the wirings 33 into the first substrate 10. For this reason, even in a case where the second substrate 20 is made of a semiconductor, the increase of loss of the SAW element 30 can be suppressed.

Further, just under the wirings and/or the pad electrodes for connection with the external circuits etc., except just under the IDT electrodes 31, the first substrate 10 may be removed or concave portions may be formed to increase the thickness of the insulation layer 35 (see the right side in FIG. 10). In that case, the electromagnetic coupling with the second substrate 20 can be further suppressed.

Note that, such a configuration can be applied also to the SAW elements 30A, 30B, and the like which will be explained later.

Other Embodiment: SAW Element 30A

The SAW element 30A is different from the SAW element 30 in the point that an intermediate layer 50 is provided between the first substrate 10 and the second substrate 20. Below, the explanation will be focused on the different points, and overlapping explanations will be omitted.

(Composite Substrate)

Figure 11:
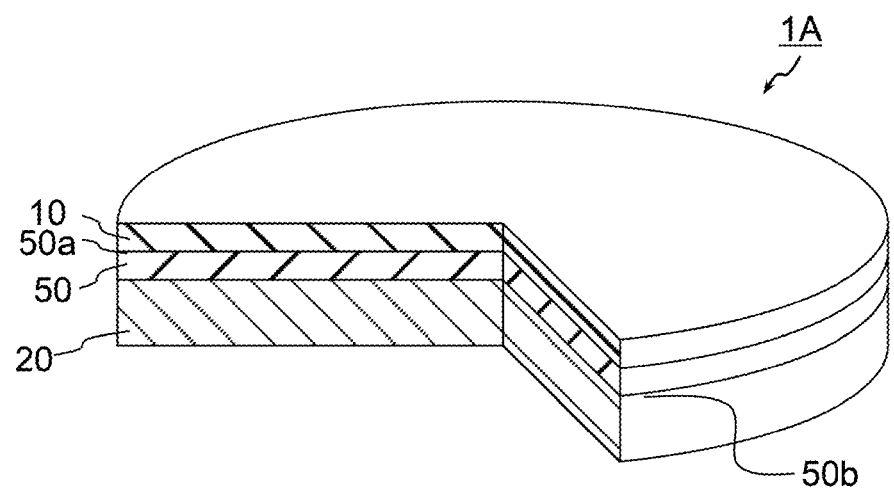
FIG. 11 is a partially cutaway perspective view of a composite substrate for manufacturing an acoustic wave element 30A.

A composite substrate 1A in the present embodiment, as shown in FIG. 11, is a so-called bonded substrate and is comprised of a first substrate 10, second substrate 20, and an intermediate layer 50 positioned between the first substrate 10 and the second substrate 20. Here, FIG. 11 is a perspective view partially cutting away the composite substrate 1A.

The intermediate layer 50 is provided with a first surface 50a and a second surface 50b which face each other. The first surface 50a is bonded to the first substrate 10, and the second surface 50b is bonded to the second substrate 20. Further, the total thickness of the first substrate 10 and the second substrate 20 becomes 1λ or less.

The material for forming the intermediate layer 50 is a material which has a slower acoustic velocity of transversal bulk wave than the first substrate 10 and has a smaller dielectric constant than the second substrate 20. Specifically, when the first substrate 10 is comprised of an LT substrate and the second substrate 20 is comprised of Si, the material may be a silicon oxide, glass material, or the like.

Such an intermediate layer 50 may be formed by forming a film on the first substrate 10 or second substrate 20 as well. Specifically, the intermediate layer 50 is formed on the first substrate 10 or second substrate 20 as a support substrate by an MBE (molecular beam epitaxy) process, ALD (atomic layer deposition) process, CVD (chemical vapor deposition) process, sputtering process, vapor deposition process, or the like. After a while, the upper surface of the intermediate layer 50 and the remaining substrate (10 or 20) may be bonded to each other by so-called direct bonding activating the surfaces by plasma, an ion gun, neutron gun, or the like, then bonding the two without a bonding layer interposed. Note that, when the second substrate 20 is Si and the intermediate layer 50 is silicon oxide, the intermediate layer 50 may be formed by thermal oxidation of the second substrate 20 as well.

The crystallinity of such an intermediate layer 50 can be freely suitably selected from among amorphous, polycrystalline, and other states. Note that, the thickness of the intermediate layer 50 will be explained later.

Further, the composite substrate 1A is divided into a plurality of sections in the same way as FIG. 2. Each section becomes a SAW element 30A. In the same way, the direction of arrangement of the electrode fingers 32 is substantially parallel to the X-axis of the piezoelectric crystal of the first substrate 10.

Here, in the SAW element 30A, the change of frequency characteristic (electrical characteristics) due to a change in temperature can be suppressed by using the composite substrate 1A.

Further, in the SAW element 30A, the first substrate 10 is thin, and the second substrate 20 is bonded to this through the intermediate layer 50. In such a SAW element 30A as well, in the same way as the SAW element 30, the occurrence of bulk wave spurious resonance can be suppressed by making the thickness of the first substrate 10 less than 1λ, preferably 0.2λ to 0.6λ.

Figure 12:
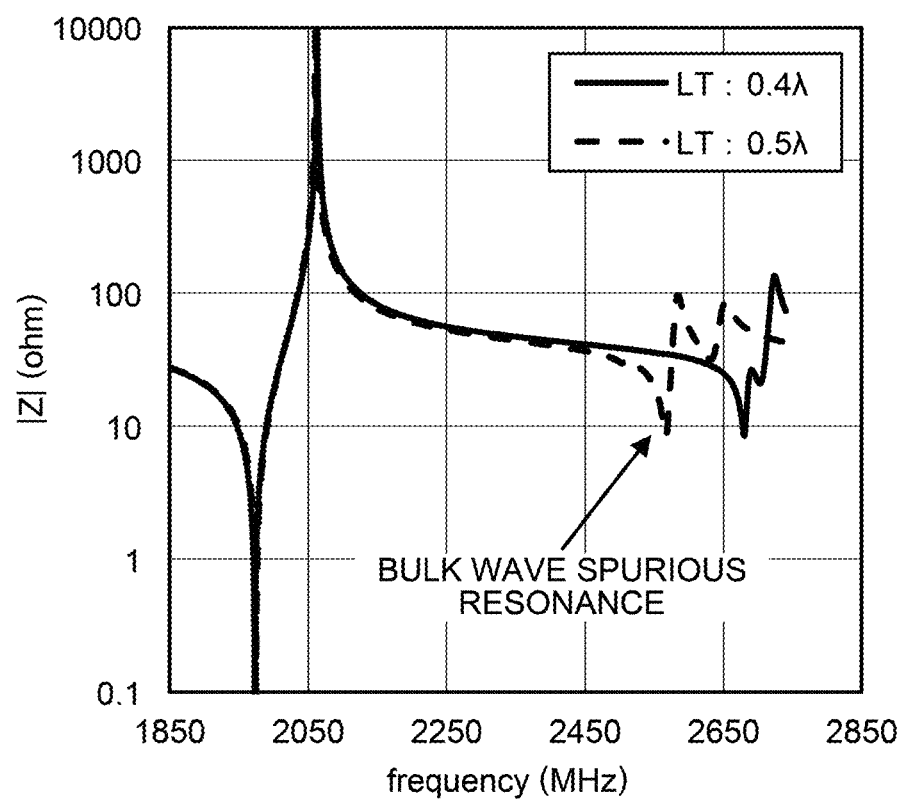
FIG. 12 is a graph showing the frequency characteristics of acoustic wave elements 30A.

FIG. 12 shows the resonance characteristics of the SAW element 30A when the thickness of the first substrate 10 is made 0.4λ and 0.5λ. Note that, as the second substrate 20, use was made of an Si single crystal having a plane orientation of (111). The Euler angles notation of this crystal plane is (−45, −54.7, 0). As an actual wafer, use was made of an Si wafer having a plane orientation of (111) and orientation flat direction of (110). It was bonded so that the orientation flat direction became the direction along the X-axis of the LT crystal forming the first substrate 10. The intermediate layer 50 was made of silicon oxide, and the thickness thereof was controlled to 0.05λ.

As apparent also from FIG. 12, according to the SAW element 30A, the frequency of the bulk wave spurious resonance can be shifted to a higher frequency side than 2500 MHz. Further, as a result, in addition to the frequency bands in the vicinities of the resonance frequency and antiresonance frequency, there is no longer bulk wave spurious resonance in a broad frequency range on a higher frequency side than the antiresonance frequency, therefore a SAW element 30A having little loss and excellent in electrical characteristics can be provided.

In this way, by making the thickness of the first substrate 10 small, an SAW element 30A excellent in electrical characteristics can be provided. However, on the other hand, the frequency characteristic of the SAW element 30A ends up being influenced by the thickness of the first substrate 10. Further, the total thickness of the first substrate 10 and the intermediate layer 50 is smaller than the wavelength, therefore part of the vibration of the SAW will also reach the second substrate 20. For this reason, the SAW element 30A ends up being influenced by the characteristics of the material of the second substrate 20.

First, the influence of the thickness of the first substrate 10 will be studied. According to the SAW element 30A, the intermediate layer 50 is arranged just under the first substrate 10. Due to the existence of this intermediate layer 50, the robustness relative to the thickness of the first substrate 10 can be raised. Below, the mechanism thereof will be explained.

In the first substrate 10 having a thickness less than the wavelength, if its thickness becomes greater, the distribution amount of the acoustic wave vibration of SAW in the first substrate 10 increases, therefore the frequency shifts to a lower frequency side. On the other hand, when the thickness of the first substrate 10 becomes greater, the distribution amounts of the SAW in the intermediate layer 50 and second substrate 20 are reduced.

Here, in the intermediate layer 50, as explained before, the acoustic velocity becomes slower than the first substrate 10. By reduction of the distribution amount of SAW in the intermediate layer 50 having such a slower acoustic velocity, the acoustic velocity in the entire SAW element 30A becomes faster, therefore the frequency characteristic shifts to a higher frequency side.

Further, in the second substrate 20, as explained before, the acoustic velocity becomes faster than the first substrate 10.

By reduction of the distribution amount of SAW in the second substrate 20 having such a fast acoustic velocity, the acoustic velocity in the entire SAW element 30A becomes slower, therefore the frequency characteristic shifts to a lower frequency side.

By employing such a configuration formed by stacking three components, in the SAW element 30A as a whole, changes of the frequency characteristic are cancelled out by each other, therefore change of the frequency can be suppressed. Here, when the first substrate 10 is thin, the drop of frequency due to a change of thickness becomes larger. Therefore, this drop of frequency can be mitigated by introducing the intermediate layer 50 which is comprised of a material having a slower acoustic velocity than that of the second substrate 20 like the first substrate 10. This can be said to make it possible to obtain the same effect as that obtained by raising the robustness by making the thickness of the first substrate 10 greater while keeping the characteristics of the bulk wave spurious resonance as they are.

Figure 13:
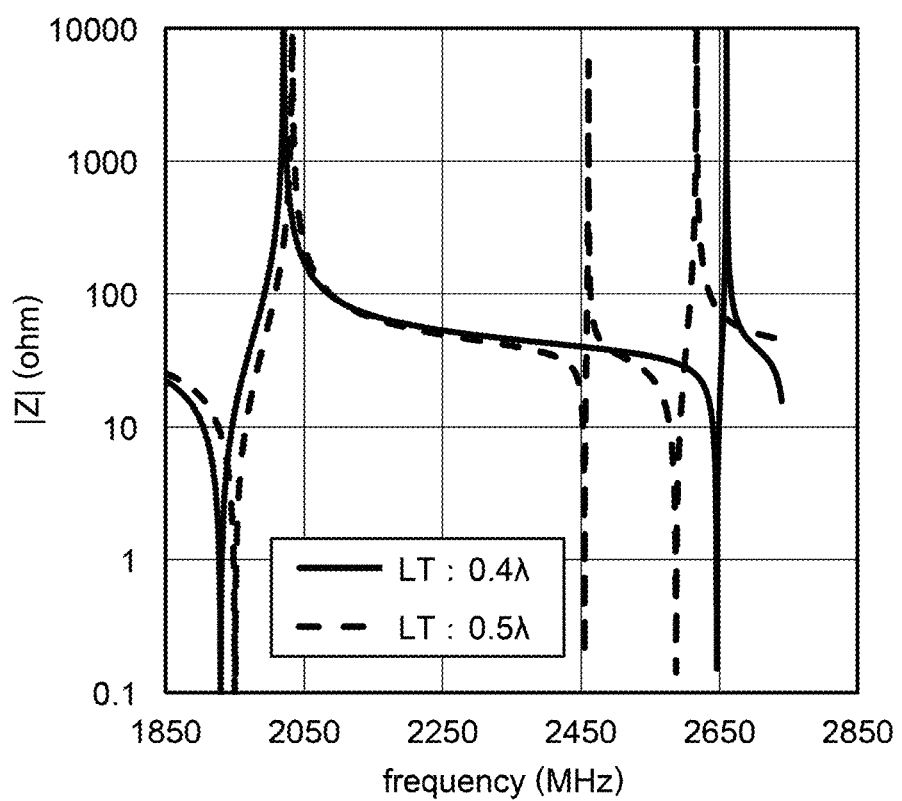
FIG. 13 is a graph showing the frequency characteristics of acoustic wave elements in comparative examples.
Figure 14A:
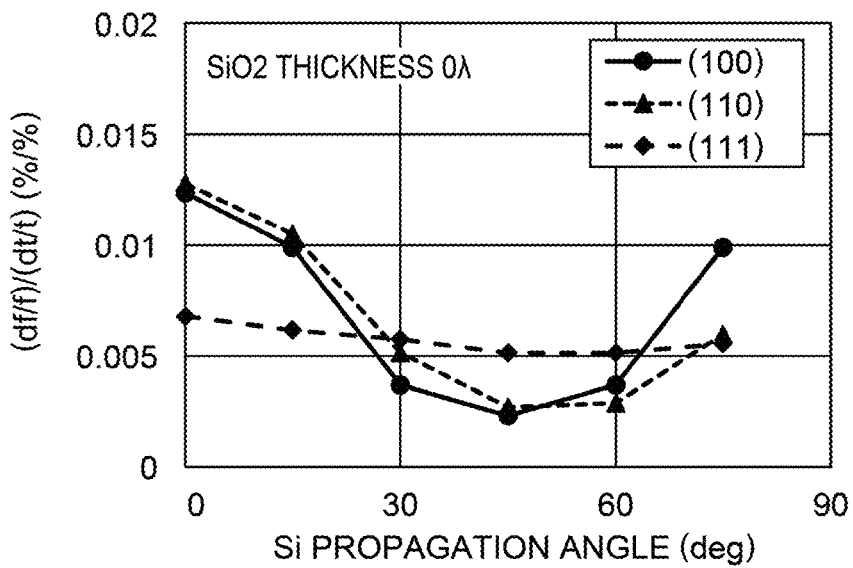
FIGS. 14A to 14C respectively show the rates of change of frequency when making the crystal plane and the φ propagation angle different.
Figure 14B:
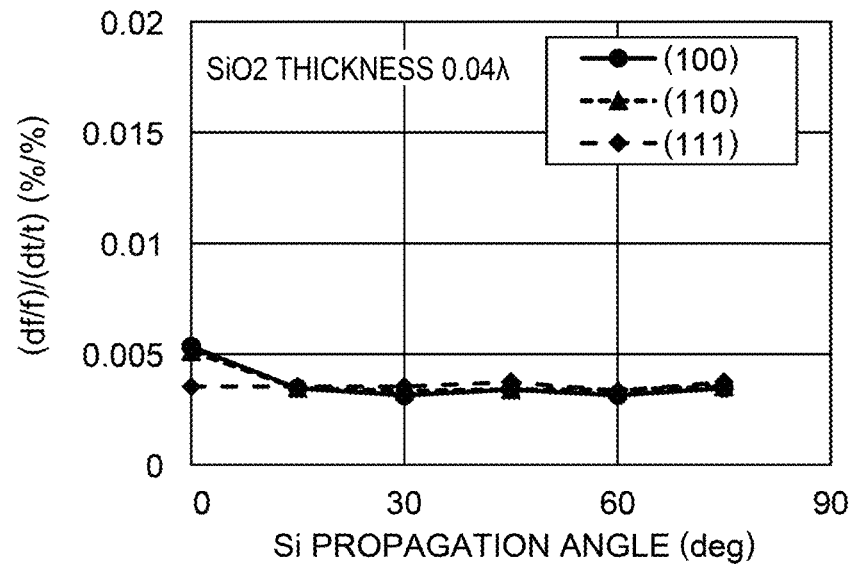
Figure 14C:
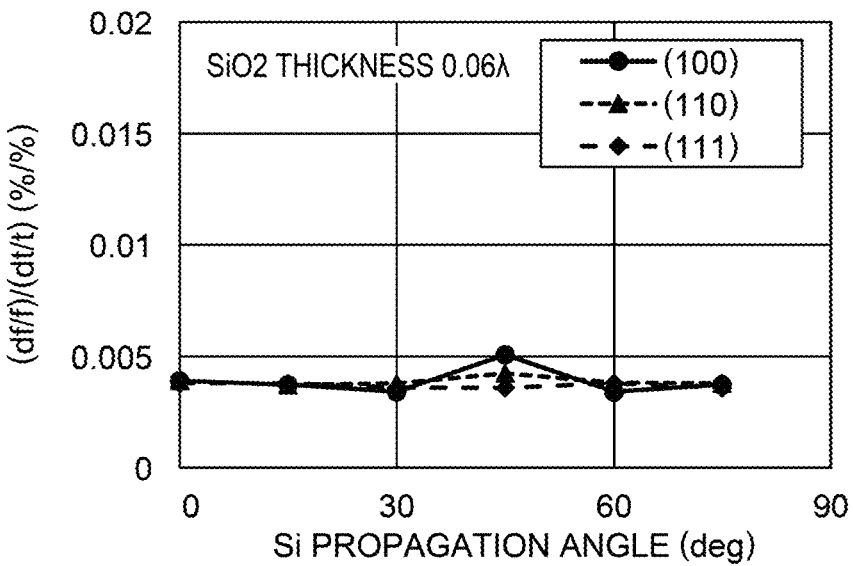
Figure 15D:
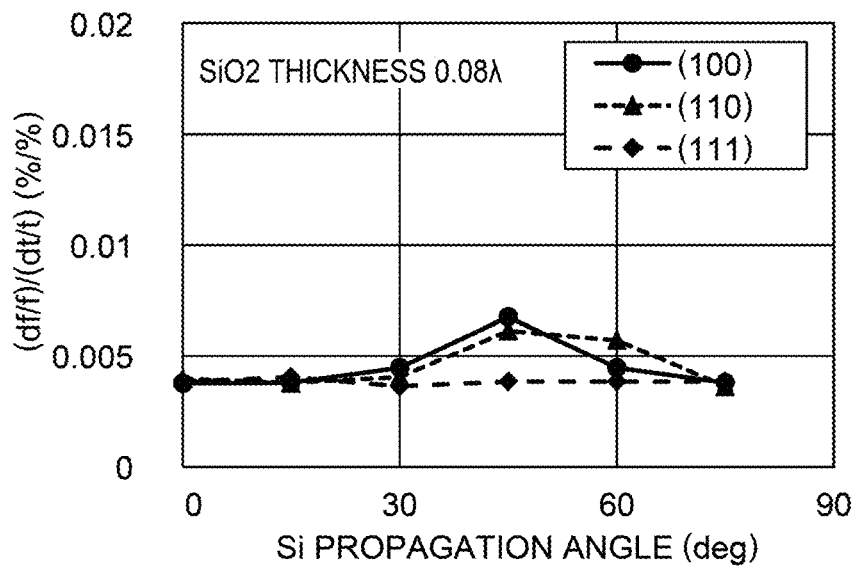
FIGS. 15D to 15F respectively show the rates of change of frequency when making the crystal plane and the φ propagation angle different.
Figure 15E:
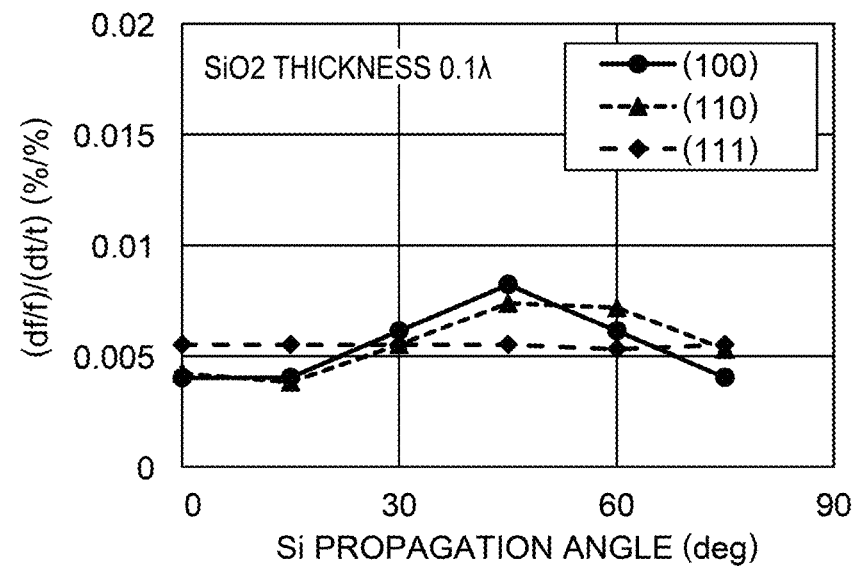
Figure 15F:
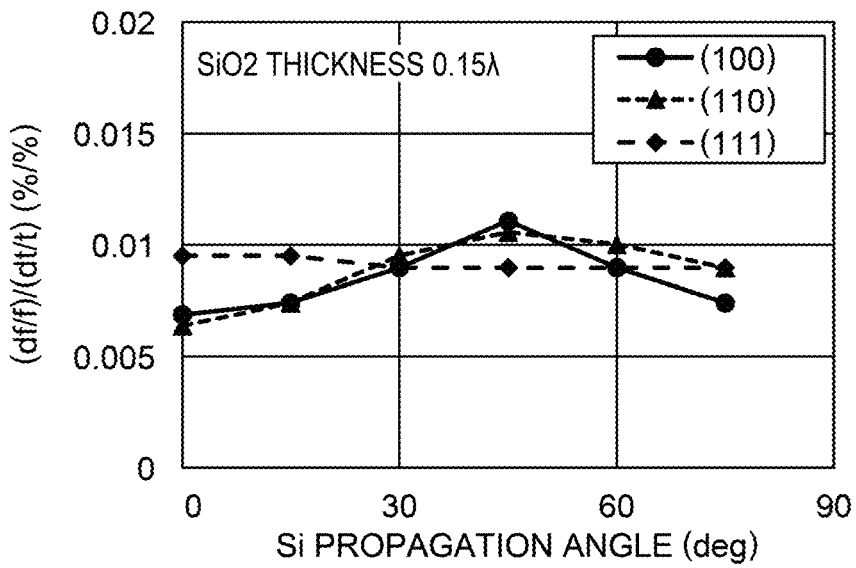

The effects by insertion of such an intermediate layer 50 will be verified. FIG. 13 shows the results of simulation of the frequency characteristics of SAW elements which are comprised of only the first substrate 10 having an equal thickness to that of the SAW element 30A shown in FIG. 12. Further, FIG. 4A shows the results of simulation of the frequency characteristics of SAW elements having the same configuration as that of the SAW element 30A except for the point that the intermediate layer 50 is not provided. Note that, in all models, the frequency characteristics when making the thickness of the first substrate 10 0.4λ and 0.5λ were simulated.

In FIG. 13, the abscissa shows the frequency (unit: MHz), and the ordinate shows the absolute value of impedance (unit: Ω). When comparing the characteristics between FIG. 13 and FIG. 4A and FIG. 12, it could be confirmed that, in the characteristic of the SAW elements 30A of the present disclosure shown in FIG. 12, the amounts of shift of the resonance frequency and antiresonance frequency relative to the variation of thickness of the first substrate 10 become smaller compared with the characteristics shown in FIG. 13 and FIG. 4A.

That is, it could be confirmed that, according to the SAW element 30A in the present disclosure, by insertion of the intermediate layer 50, an element having a high robustness relative to the variation of thickness of the first substrate 10 could be obtained.

However, if the intermediate layer 50 is made too thick, it ends up overpowering the effect of the second substrate 20 side. Therefore, it is necessary to make the thickness of the intermediate layer 50 smaller than at least the thickness of the first substrate 10 having a faster acoustic velocity. Specific thicknesses will be explained later.

<Orientation of Si Plane>

Next, in order to further raise the robustness, combinations of detailed configurations of the second substrate 20 and intermediate layer 50 will be studied.

In order to raise the robustness relative to the variation of the thickness of the first substrate 10, specifically it is necessary to make the rate of change of frequency relative to the change of the thickness of the first substrate 10 lower.

Therefore, the rate of change of frequency was simulated by making the thickness of the intermediate layer 50 different or making the plane orientation and the rotation angle (ψ propagation angle) relative to the X-axis ($X_{LT}$) of the first substrate 10 different when using the Si single crystal substrate as the second substrate 20.

Here, the results of simulation of the rates of change of frequency of the SAW element when changing ψ for different plane orientations will be shown in FIGS. 14A to 14C and FIGS. 15D to 15F. In FIGS. 14A to 14C and FIGS. 15D to 15F, the abscissas show the propagation angles ψ (unit: deg), and the ordinates show the rates of change of frequency. Further, FIGS. 14A to 14C and FIGS. 15D to 15F respectively show results of simulation when changing the thickness of $SiO_2$ forming the intermediate layer 50 from 0λ to 0.15λ. 0λ indicates the case where there is no intermediate layer 50. Note that, the thickness of the first substrate 10 was made a constant 0.5λ.

As apparent from these views, when the thickness of the intermediate layer 50 is less than 0.1λ, no matter what the crystal orientation of the substrate used for forming the second substrate 20, the rate of change of frequency can be made smaller compared with the model of the general (111) plane-0° propagation part not provided with an intermediate layer 50 (model 1).

Further, when the thickness of the intermediate layer 50 is 0.04λ to 0.06λ, the rate of change of frequency can be stably suppressed without regard to the crystal orientation of the second substrate 20. On the other hand, when the thickness of the intermediate layer 50 is 0.07λ to 0.08λ, by making the plane orientation of the second substrate 20 (111), the rate of change of frequency can be stably kept down without regard to the difference of the propagation angle.

Further, when the thickness of the intermediate layer 50 is 0.1λ or more, by making the crystal orientation of the second substrate 20 (100) or (110) and forming a 0°±30° propagation part, the rate of change of frequency can be kept down more than model 1.

Note that, the same simulations as the simulations shown in FIGS. 14A to 14C and FIGS. 15D to 15F were carried out while making the thickness of the first substrate 10 0.4λ to 0.6λ. However, the same tendency was confirmed. Further, even when the thickness of the first substrate 10 was changed, no large change was seen in the rate of change of frequency, therefore it was confirmed that the influence of the change of characteristic with respect to the change of the thickness of the first substrate 10 was reduced due to the existence of the intermediate layer 50.

Figure 16A:
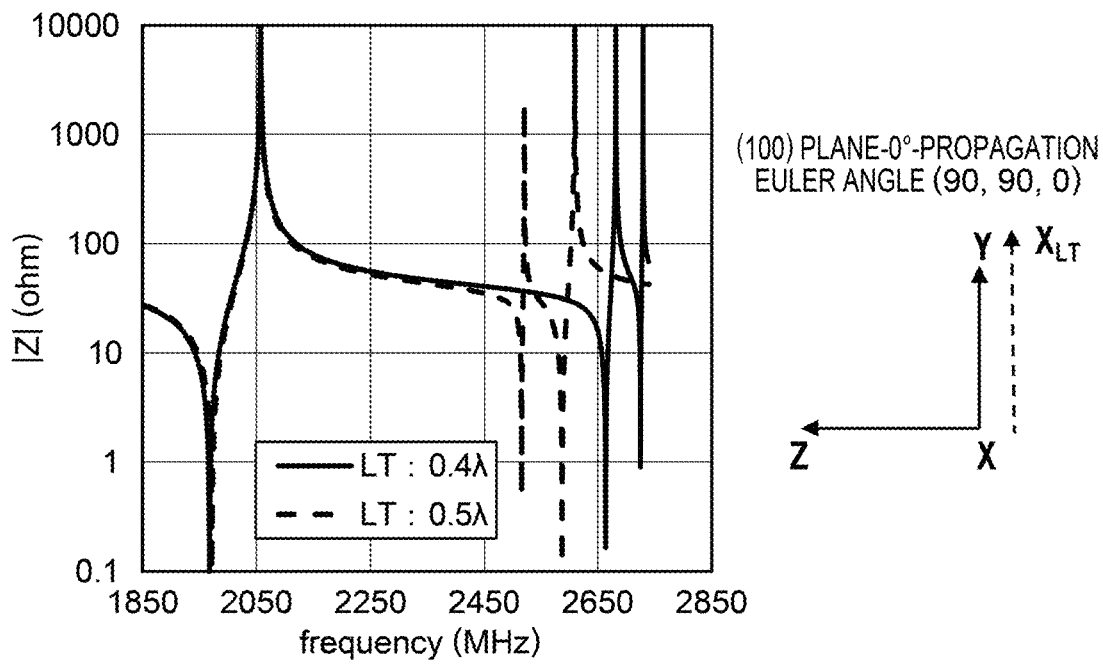
FIGS. 16A and 16B are graphs showing the frequency characteristics of SAW elements.
Figure 16B:
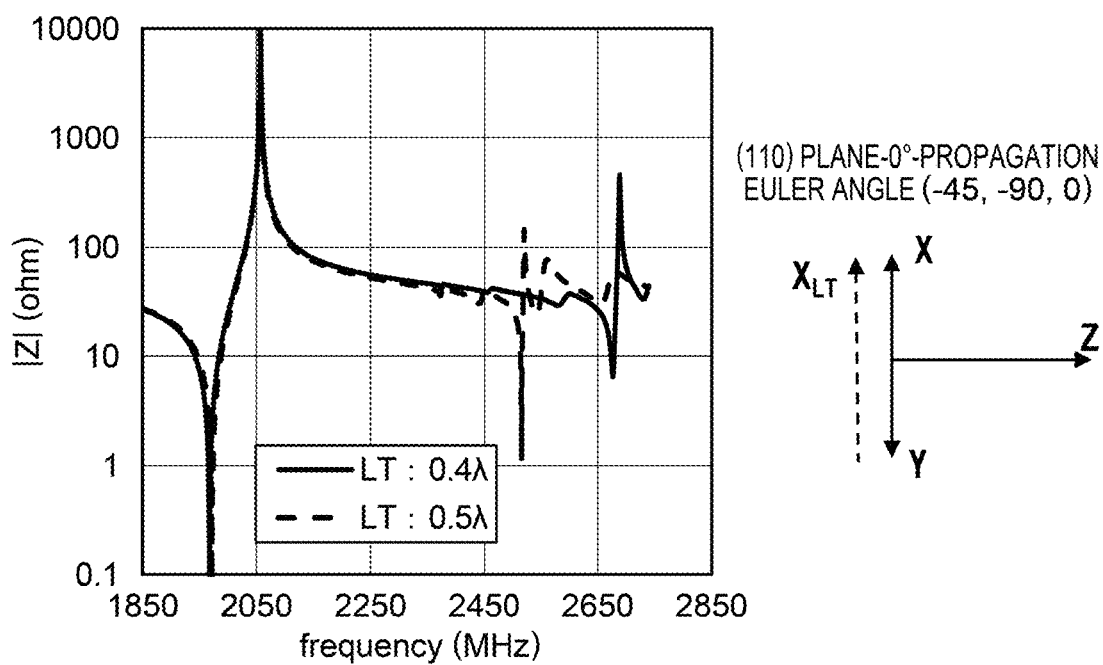

The frequency characteristic of such a SAW element 30A will be shown in FIGS. 16A and 16B. In FIGS. 16A and 16B, the abscissas show the frequencies, and the ordinates show the absolute values of impedance. These show the frequency characteristics at the time when the thickness of the first substrate 10 is made 0.4λ and the time when it is made 0.5λ. Note that, in FIG. 16A, the plane orientation of the second substrate 20 was made (100) to form the 0° propagation part. In both of FIG. 16A and FIG. 16B, the thickness of the intermediate layer 50 was made 0.1λ.

As apparent from FIGS. 16A and 16B and FIG. 12, according to the SAW element 30A, it was confirmed that there was no variation in any of the resonance frequency, antiresonance frequency, and the difference between the resonance frequency and the antiresonance frequency even when the thickness of the first substrate 10 varied and that the change of the frequency characteristic could be suppressed.

Further, in FIG. 12 and FIGS. 16A and 16B, when the thicknesses of the first substrates 10 were equal, even when the plane orientation of the second substrate 20 was made different or even if the thickness of the intermediate layer 50 was made different, the difference between the resonance frequency and the antiresonance frequency was constant. That is, as confirmed, according to the SAW element 30A, a stable frequency characteristic could be realized even with some variation of thickness of the intermediate layer 50.

As described above, when the thickness of the first substrate 10 is made less than 1λ, the second substrate 20 is comprised of a material which is faster in acoustic velocity of the transversal bulk wave compared with the first substrate 10, and the intermediate layer 50 is comprised of a material which is slower in acoustic velocity of the transversal bulk wave than the first substrate 10, an SAW element 30A excellent in robustness can be provided. In particular, when the thickness of the intermediate layer 50 is less than 0.1λ, the robustness can be raised more. In this, when it is made 0.04λ to 0.08λ, the robustness can be further raised. Further, when the thickness of the intermediate layer 50 is 0.1λ or more, by using as the second substrate 20 an Si single crystal with a crystal plane with plane orientation of (100) or (110) and inclining the same within a range of −30° to 30° about the normal line of the upper surface of the second substrate 20, an SAW element 30A having a higher reliability can be provided.

Further, when an amorphous or polycrystalline intermediate layer 50 is provided between the first substrate 10 and the second substrate 20, unintended impurities can be gettered by the intermediate layer 50. For this reason, segregation of impurities at the bonding interface or diffusion to the second substrate 20 side can be suppressed.

In the SAW element 30A in the present disclosure, the thickness of the first substrate 10 is small, so the element is influenced by the second substrate 20. Therefore, preferably the change of characteristics of the second substrate 20 due to such diffusion of impurities is prevented. Specifically, diffusion of lithium, tantalum, oxygen, or the like from the LT single crystal or $LiNbO_3$ single crystal used for forming the first substrate 10 to the Si substrate used for forming the second substrate 20 can be suppressed. If these elements are diffused into Si, the conductivity of Si becomes large, therefore the result becomes electrical loss or the parasitic capacitance becomes large resulting in deterioration of electrical characteristics of the acoustic wave element.

Further, the case of using $SiO_2$ for forming the intermediate layer 50 was explained in the example explained above, but the material is not limited to this. For example, $Ta_2O_5$ may be used as well. Even in a case where $Ta_2O_5$ is used, the same tendency as that in the case of $SiO_2$ is confirmed, therefore it may be suitably optimized based on the same judgment standard.

<Strength of Bulk Wave Spurious Resonance>

In the example explained above, the propagation angle of the second substrate 20 was set from the viewpoint of the rate of change of frequency. However, the propagation angle may be set from the viewpoint of the strength of the bulk wave spurious resonance as well.

Figure 28:
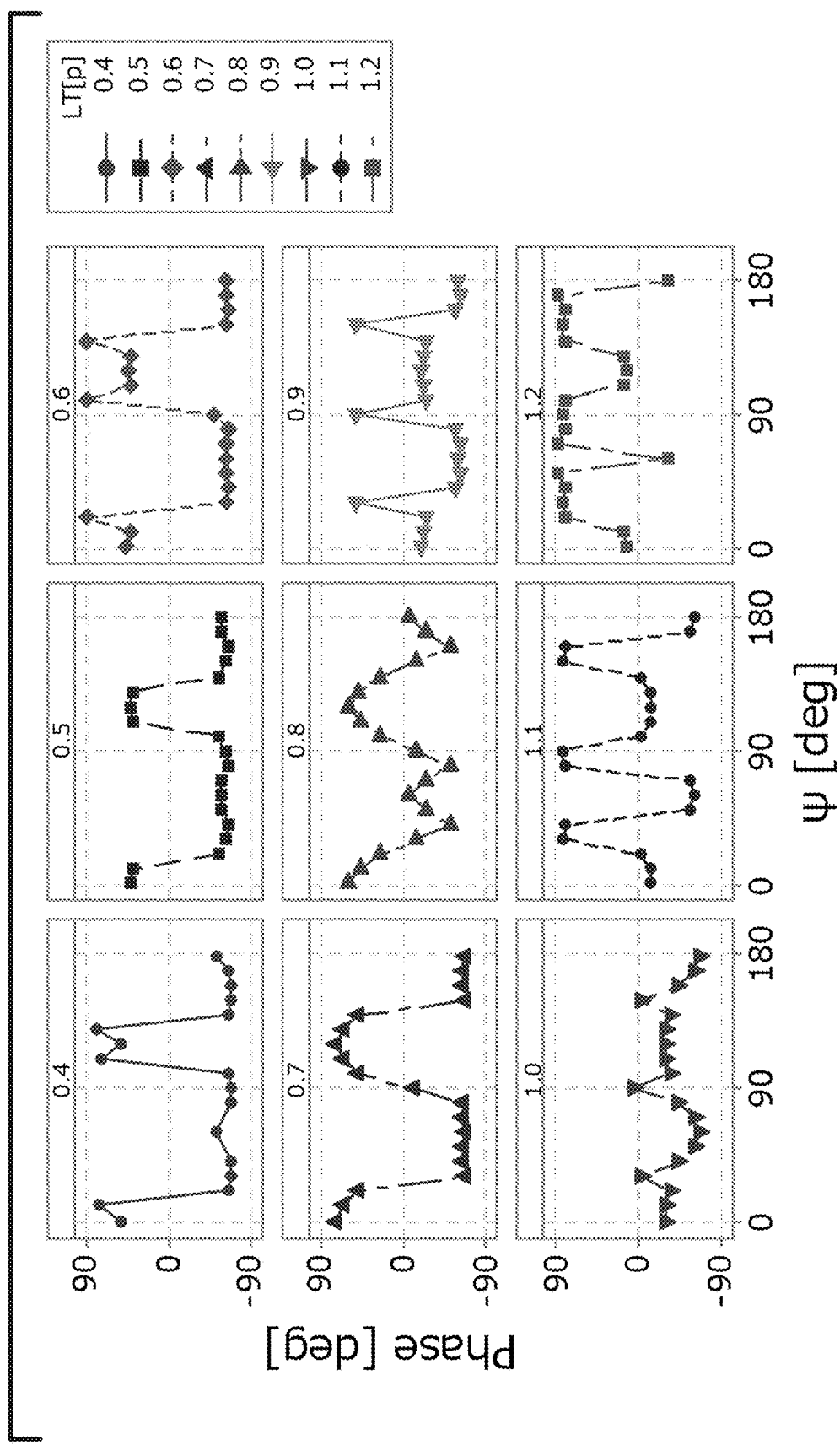
FIG. 28 illustrates graphs calculating a correlation among the thickness of the first substrate, the propagation angle of the second substrate, and the maximum phase value of a bulk wave spurious resonance in the SAW element 30A.
Figure 29:
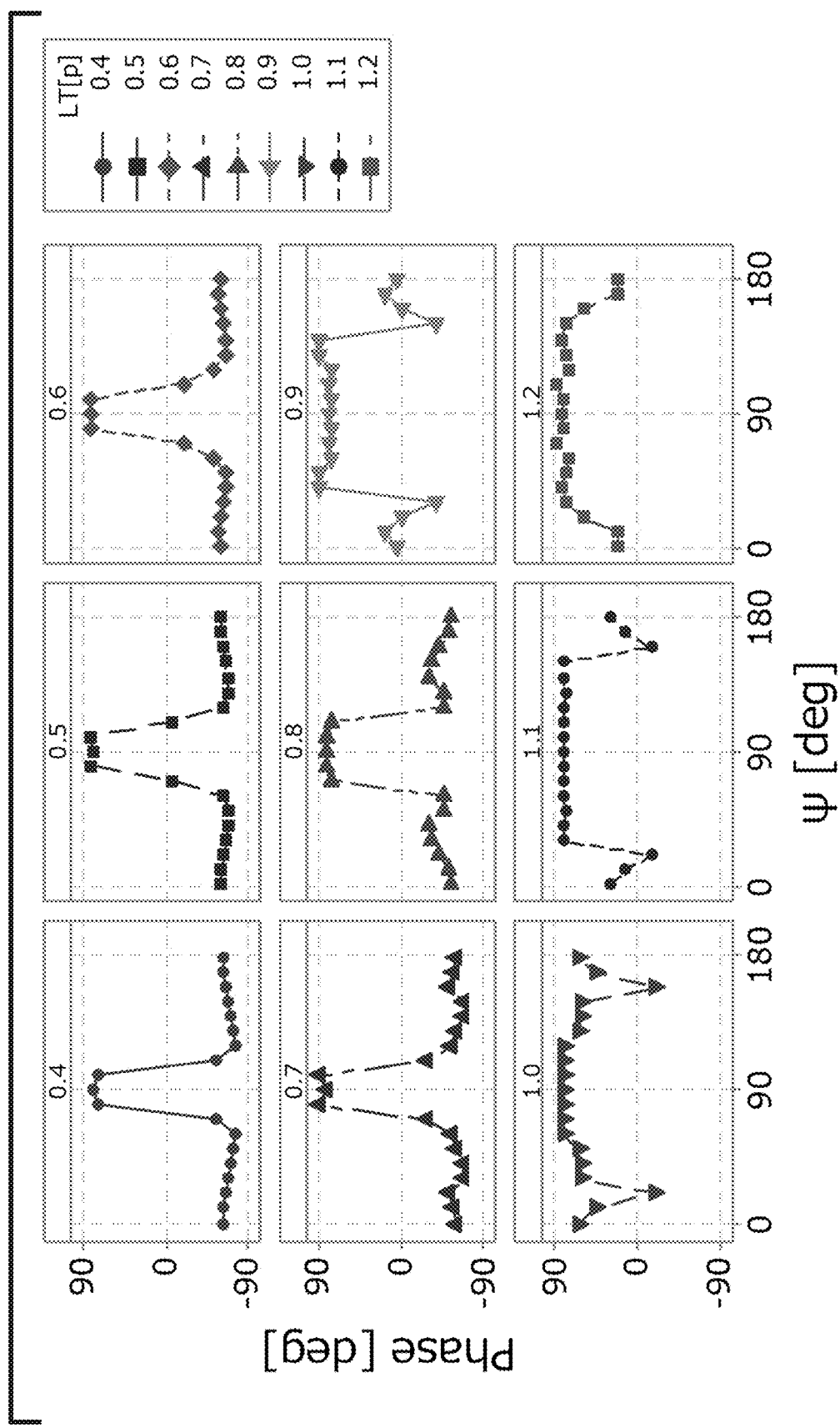
FIG. 29 illustrates graphs calculating a correlation among the thickness of the first substrate, the propagation angle of the second substrate, and the maximum phase value of a bulk wave spurious resonance in the SAW element 30A.
Figure 30:
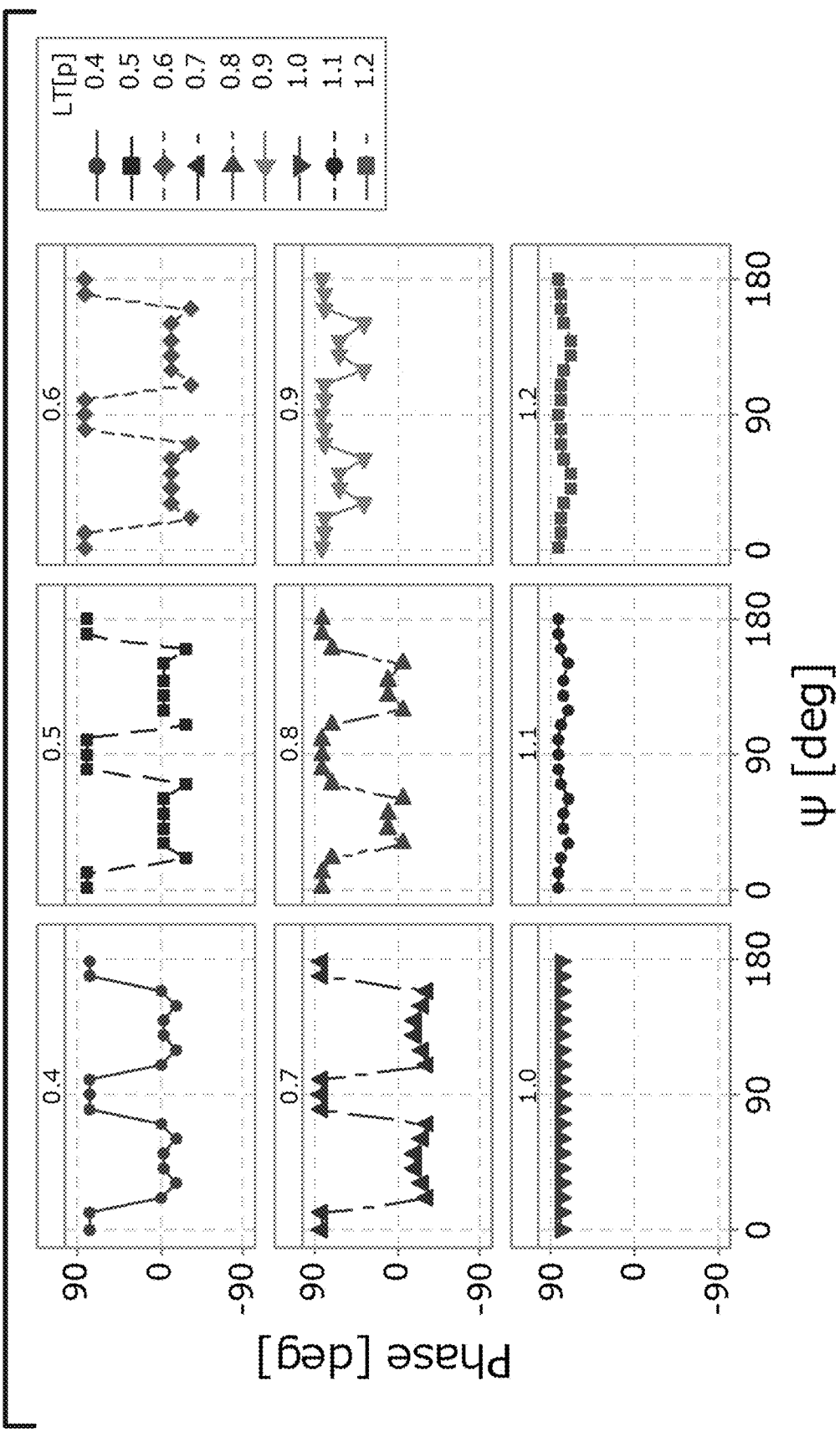
FIG. 30 illustrates graphs calculating a correlation among the thickness of the first substrate, the propagation angle of the second substrate, and the maximum phase value of a bulk wave spurious resonance in the SAW element 30A.

FIG. 28 to FIG. 30 show the results of performing the same calculations as those in FIG. 25 to FIG. 27 for the SAW element 30A. FIG. 28 shows the results where Si (111) was used for forming the second substrate 20 and an $SiO_2$ layer having a thickness of 0.018λ was provided for forming the intermediate layer 50.

As apparent from FIG. 28, it could be confirmed that the maximum phase value greatly varied due to the propagation angle and that the variation repeated in a 120° cycle. Further, it could be confirmed that the maximum phase value greatly varied also according to the thickness of the first substrate 10, the range of propagation angle where the maximum phase value was small became narrower along with an increase of the thickness, and there was almost no region where the spurious transmission became small when the thickness was 1.2 p or more (0.6λ or more).

Based on the above results, the relationship between the propagation angle and the thickness D of the first substrate 10 by which the maximum phase value became −50 deg or less was derived. Specifically, the bulk wave spurious resonance strength can be suppressed when simultaneously satisfying the following equations:

$41.1 \times D + 2.33 \leq \psi \leq -40.07 \times D + 115.48$ $0.4p \leq D \leq 1.1p$ Note that, even at the propagation angle of $\psi + 120 \times \alpha$, the bulk wave spurious resonance strength can be suppressed in the same way. Here, $\alpha$ is 0, 1, or 2.

Although the cause is not clear, when the thickness of the first substrate 10 was 0.8 p, the maximum phase value tended to become larger. Therefore, more preferably, in the relational equations explained above, if the range of thickness of 0.75 p<D<0.85 p is excluded, the bulk wave spurious resonance can be suppressed more stably.

In the same way, the results of studies for the case where use was made of Si (110) as the second substrate 20 will be shown in FIG. 29. As apparent from FIG. 29, it could be confirmed that the maximum phase value greatly varied according to the propagation angle and that the variation repeated by a cycle of 180°. Further, it could be confirmed that the maximum phase value greatly varied also according to the thickness of the first substrate 10, the range of propagation angle where the maximum phase value was small became narrower along with an increase of the thickness, and there was no region where the maximum phase became −50 deg or less when the thickness was 0.9 p or more (0.45λ or more).

Based on the above results, the relationship between the propagation angle and the thickness D of the first substrate 10 by which the maximum phase value became −50 deg or less was derived. Specifically, the bulk wave spurious resonance strength can be suppressed when simultaneously satisfying the following equations:

$-60 \leq \psi \leq 60$ $0.4p \leq D \leq 0.7p$

Note that, even at the propagation angle of $\psi + 180 \times \alpha$, the bulk wave spurious resonance strength can be suppressed in the same way. Here, $\alpha$ is 0 or 1.

Further, the relationship between the propagation angle and the thickness of the first substrate 10 by which the maximum phase value becomes clearly small compared with the vicinity of the propagation angle 90° is as follows:

$75.23 \times D - 104.55 \leq \psi \leq -75.23 \times D + 104.55$ $0.4p \leq D \leq 1.1p$ Next, the results of studies for the case where Si (100) was used for forming the second substrate 20 will be shown in FIG. 30. As apparent from FIG. 30, it could be confirmed that the maximum phase value greatly varied according to the propagation angle and that the variation repeated by a cycle of 90°. Further, it could be confirmed that the maximum phase value greatly varied also according to the thickness of the first substrate 10, the range of propagation angle where the maximum phase value was small became narrower along with an increase of the thickness, and there was almost no region where the spurious transmission became small when the thickness was 1.0 p or more (0.5λ or more). Further, compared with the other crystal orientations, the maximum phase value was large as a whole.

Based on the above results, the relationship between the range of propagation angle and the thickness of the first substrate 10 where the maximum phase value became clearly small compared with the vicinity of the propagation angle of 90° was derived. Specifically, the bulk wave spurious resonance strength can be suppressed when simultaneously satisfying the following equations:

$$22.86 \times D + 8.48 \leq \psi \leq 22.86 \times D + 81.52$$

$$0.4p \leq D \leq 0.9p$$

Note that, even at the propagation angle of $\psi + 90 \times \alpha$, the bulk wave spurious resonance strength can be suppressed in the same way. Here, $\alpha$ is 0, 1, 2, or 3.

Further, the relationship between the propagation angle and the thickness of the first substrate 10 by which the maximum phase value becomes 0 deg or less is as follows:

$$30 \leq \psi \leq 60$$

$$0.4p \leq D \leq 0.8p$$

From the results explained above, in the SAW element 30A, in order to suppress the strength of the bulk wave spurious resonance at the same time of suppression of the rate of change of frequency, the thickness of the intermediate layer 50 may be adjusted to establish the relationships described above. Further, in addition to this, the propagation angle may be made an angle other than 45°±5° as well.

Here, the same calculations were carried out by changing the cut angle of the LT substrate in a range of 30° to 60°. However, for the Si-(111) and (110) planes, the same tendency could be confirmed without regard to the cut angle so far as it was the Y-cut. For the Si (100) plane, the same tendency could be confirmed so far as it was a Y-cut not less than 36°.

Note that, the combinations of the thickness D of the first substrate 10 and the propagation angle of the second substrate 20 capable of suppressing the bulk wave spurious resonance as shown in FIGS. 28 to 30 are shown in FIG. 32.

(Modification: Conductivity of Second Substrate 20)

In the example explained above, the resistivity of the second substrate 20 was not particularly restricted. However, the resistivity may be made 1000 Ω·cm or more as well. As explained above, the thickness of the first substrate 10 is small, therefore the frequency characteristic of the SAW element 30 is influenced by the second substrate 20. Therefore, among the characteristics of the second substrate 20, the resistivity was focused on. Specifically, the frequency characteristic of impedance of the SAW element 30 when making the resistivities different were simulated, and the maximum value of the phase of the impedance and the Q-value at the resonance frequency were derived. The results thereof will be shown in FIGS. 17A to 17C.

Figure 17A:
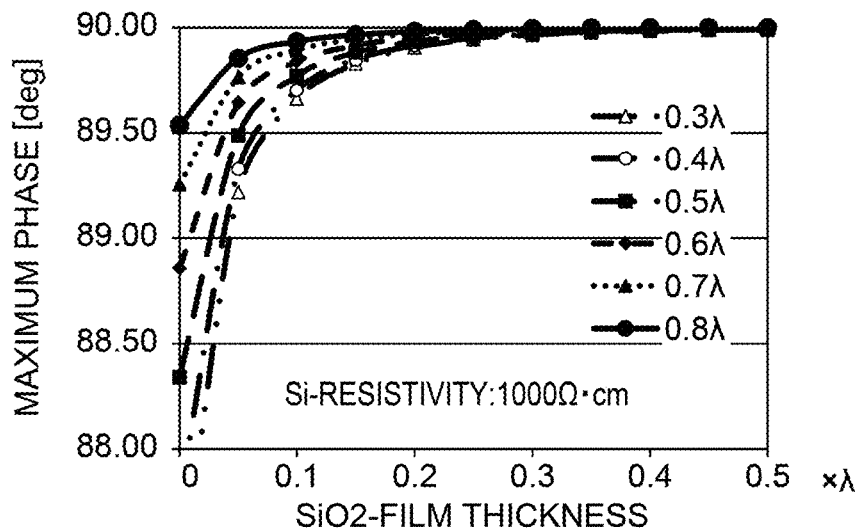
FIGS. 17A to 17C are graphs showing a correlation between the resistivity of the second substrate and the frequency characteristic of the SAW element.
Figure 17B:
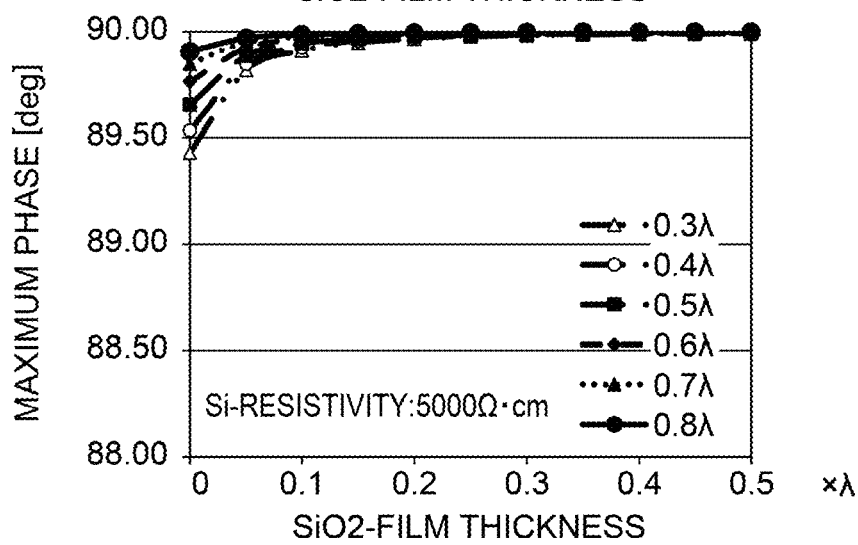
Figure 17C:
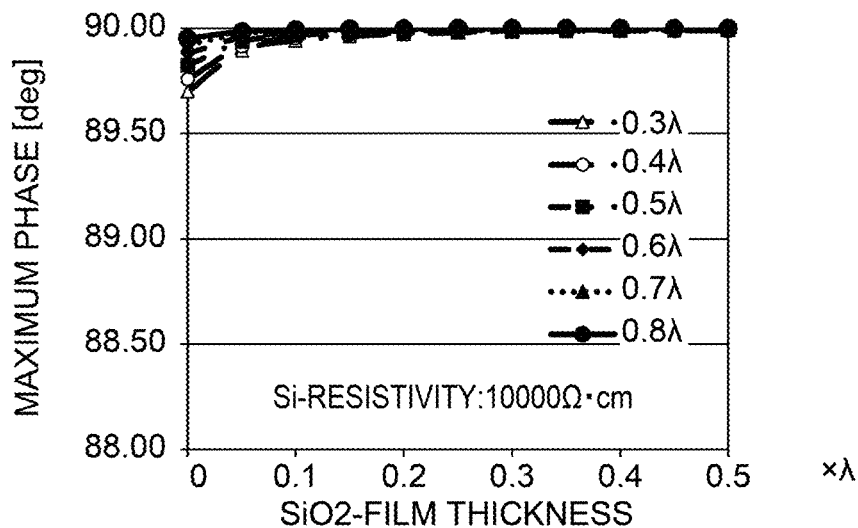

In FIGS. 17A to 17C, the thicknesses of the intermediate layer 50 when forming the intermediate layer 50 by $SiO_2$ are shown on the abscissas, and the maximum values (unit: deg) of the phase of the impedance are shown on the ordinates. Further, each of FIGS. 17A to 17C shows a case where the resistivity (unit: Ω·cm) of the second substrate 20 is changed in a range of 1000 to 10000 Ω·cm.

As apparent from FIGS. 17A to 17C, it was confirmed that the maximum phase became high and occurrence of loss could be suppressed by inserting the intermediate layer 50. This is because, by configuring the intermediate layer 50 by a material having a smaller dielectric constant than the second substrate 20, electromagnetic coupling of the electrode group including the IDT electrode 31 and the second substrate 20 can be suppressed.

For example, if the resistivity of the second substrate 20 is 1000 Ω·cm or more, by making the thickness of the intermediate layer 50 0.1λ or more, even if the thickness of the first substrate 10 changes, the maximum phase can be controlled to a good value of 89.5° or more. Note that, as the results of simulation of the Q-value at this time, it could be confirmed that a good value of not less than 5000 was obtained. From the above description, when the thickness of the intermediate layer 50 is made 0.1λ or more, the resistivity of the second substrate 20 may be made 1000 Ω·cm or more as well.

Further, when the resistivity of the second substrate 20 is set to 5000 Ω·cm or more, even in a case where the thickness of the intermediate layer 50 is 0.05λ, the maximum phase can be controlled to a good value such as 89.8° or more. Note that, it could be confirmed from the results of simulation of the Q-value at this time that a good value not less than 5000 could be obtained. From the above description, the resistivity of the second substrate 20 may be made 5000 Ω·cm or more as well.

For example, when an Si single crystal substrate is used for forming the second substrate 20, it is necessary to reduce the amount of dopant in order to lower the conductivity (raise the resistivity). However, in a case where heat is added in the process of bonding the first substrate 10 and the second substrate 20 or process after bonding (for example process of forming IDT), the ingredients of the first substrate 10 diffuse as impurities into the Si single crystal substrate, so there is a possibility of raising the conductivity of the region positioned on the side of the first substrate 10 in the Si single crystal substrate. The intermediate layer 50 is effective for preventing this as well.

Other Embodiment: SAW Element 30B

In the SAW element 30A explained above, the case where the intermediate layer 50 was a single layer was explained as an example. However, a SAW element 30B provided with a plurality of layers may be employed as well.

Figure 18:
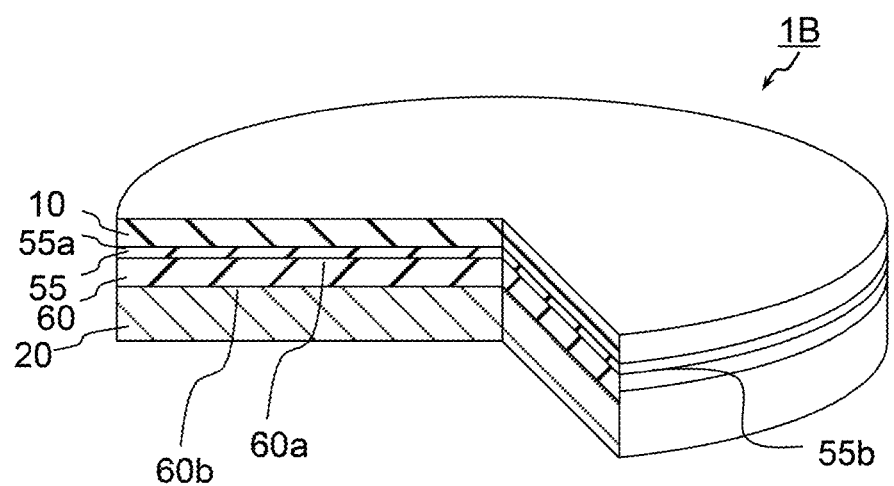
FIG. 18 is a partially cutaway perspective view of a composite substrate for manufacturing a SAW element 30B.

A composite substrate 1B in the present embodiment, as shown in FIG. 18, is a so-called bonded substrate and is comprised of a first substrate 10, a second substrate 20, and a first intermediate layer 55 and second intermediate layer 60 which are positioned between the first substrate 10 and the second substrate 20. Here, FIG. 18 shows a perspective view cutting away a portion of the composite substrate 1B.

The first intermediate layer 55 and second intermediate layer 60 are positioned between the first substrate 10 and the second substrate 20. In other words, the second substrate 20, second intermediate layer 60, first intermediate layer 55, and first substrate 10 are stacked in this order to configure the composite substrate 1B.

The first intermediate layer 55 is provided with a first surface 55a and a second surface 55b which face each other and bonds the first surface 55a to the first substrate 10. The second intermediate layer 60 is provided with a third surface 60a and a fourth surface 60b which face each other. The third surface 60a is bonded to the second surface 55b, and the fourth surface 60b is bonded to the second substrate 20.

The material configuring the first intermediate layer 55 is one having a faster transverse acoustic wave velocity than the first substrate 10. Further, in order to suppress unintended electromagnetic coupling with the IDT electrode 31 which will be explained later, a material having a lower dielectric constant than the first substrate 10 may be used as well. Specifically, when the first substrate 10 is comprised of an LT substrate, the first intermediate layer 55 may be formed by aluminum nitride (AlN), silicon nitride (SiNx), or aluminum oxide ($Al_2O_3$). Note that, when use is made of AlN, SiNx, $Al_2O_3$, and the like, the layer contains them as principal ingredients. For example, the layer does not contain a secondary ingredient in an amount exceeding 10%

The material configuring the second intermediate layer 60 is a material having a slower transverse acoustic wave velocity than the first substrate 10. Further, in order to suppress unintended electromagnetic coupling with the IDT electrode 31 which will be explained later, use may be made of a material having a lower dielectric constant than the first substrate 10 as well. Specifically, when the first substrate 10 is comprised of an LT substrate, the second intermediate layer 60 may be formed by silicon oxide (SiOx), a glass material, or the like. Note that, when use is made of SiOx, the layer contains this as its principal ingredient. For example, it does not contain a secondary ingredient in an amount exceeding 10%

Such intermediate layers 55 and 60 may be formed by film formation on the first substrate 10 or on the second substrate 20. Specifically, the intermediate layers 55 and 60 are formed in order on the first substrate 10 or second substrate 20 formed as the support substrate by the MBE process, ALD process, CVD process, sputtering process, vapor deposition process, or the like. After a while, the upper surface of the intermediate layer (55 or 60) and the remaining substrate (10 or 20) may be bonded by so-called direct bonding activating the bonding surfaces by plasma, an ion gun, neutron gun, or the like, then bonding the two without a bonding layer. Further, the first intermediate layer 55 may be formed on the first substrate 10 and the second intermediate layer 60 may be formed on the second substrate 20, then the two intermediate layers (55 and 60) may be bonded to each other by so-called direct bonding.

Note that, when the second substrate 20 is made of Si and the second intermediate layer 60 is made of silicon oxide, the second intermediate layer 60 may be formed by thermal oxidation of the second substrate 20 as well.

The crystallinities of such intermediate layers 55 and 60 can be freely suitably selected from among amorphous, polycrystalline, and other states. Note that, the thicknesses of the intermediate layers 55 and 60 will be explained later.

Further, the composite substrate 1B is divided into a plurality of sections in the same way as FIG. 2. Each section becomes a SAW element 30B. Specifically, the composite substrate 1B is cut for each section thereby forming the SAW elements 30B. The SAW element 30B is the same as FIG. 2 in the point that the IDT electrode 31 exciting the SAW is formed on the upper surface of the first substrate 10 and the direction of arrangement of the electrode fingers 32 is substantially parallel to the X-axis of the piezoelectric crystal of the first substrate 10.

Here, according to the SAW element 30B, a total thickness of the first substrate 10 and the intermediate layers 55 and 60 is smaller than the wavelength. Therefore, in the same way as the SAW elements 30 and 30A, a portion of the SAW ends up reaching the second substrate 20 as well. Therefore, the SAW element 30B is influenced by the characteristics of the material of the second substrate 20.

According to the SAW element 31B in the present disclosure, the intermediate layers 55 and 60 are arranged just under the first substrate 10. Due to the presence of these intermediate layers 55 and 60, the robustness relative to the thickness of the first substrate 10 can be raised. Below, the mechanism thereof will be explained.

In the first substrate 10 having a thickness less than the wavelength, if the thickness becomes smaller, the acoustic wave vibration of the SAW is closed in the first substrate 10, and the frequency characteristic shifts to a lower frequency side. On the other hand, if the thickness of the first substrate 10 becomes greater, the distribution amount of the SAW in the intermediate layers 55 and 60 and second substrate 20 is reduced.

Here, in the first intermediate layer 55, as explained before, the acoustic velocity becomes faster than the first substrate 10. Due to reduction of the distribution amount of the SAW in such a first intermediate layer 50 having a faster acoustic velocity, the acoustic velocity of the entire SAW element 30B becomes slower, therefore the frequency characteristic shifts to a lower frequency side.

Next, in the second intermediate layer 60, as explained before, the acoustic velocity becomes slower than the first substrate 10. Due to reduction of the distribution amount of the SAW in such an intermediate layer 50 having a slower acoustic velocity, the acoustic velocity of the entire SAW element 30B becomes faster, therefore the frequency characteristic shifts to a higher frequency side.

Further, in the second substrate 20, as explained before, the acoustic velocity becomes faster than the first substrate 10. Due to reduction of the distribution amount of the SAW in such a second substrate 20 having a faster acoustic velocity, the acoustic velocity of the entire SAW element 30B becomes slower, therefore the frequency characteristic shifts to a lower frequency side.

Due to the configuration in which the four components are stacked, in the SAW element 30B as a whole, changes of the frequency characteristics are cancelled out by each other, therefore a change of frequency can be suppressed. In particular, due to a component having a high acoustic velocity and a component having a low acoustic velocity being alternately stacked, the mutual influences by the variations in thicknesses can be mitigated, therefore there can be provided the SAW element 30B having a high robustness not only with respect to the variation of the thickness of the first substrate 10, but also with respect to the variation of the thicknesses of the two intermediate layers 55 and 60.

Here, when an LT substrate is used for forming the first substrate 10, either of AlN or SiN is used for forming the first intermediate layer 55, $SiO_2$ is used for forming the second intermediate layer 60, and an Si single crystal substrate is used for forming the second substrate 20, the first intermediate layer 55 becomes the fastest in acoustic velocity, and the second intermediate layer 60 becomes the slowest in acoustic velocity. That is, there can be provided the SAW element 30B in which the effect of correction of a frequency shift by the intermediate layers 55 and 60 is great and the influence by the variation of thickness of the first substrate 10 and the second substrate 20 can be reduced by the intermediate layers 50 and 60, so the characteristics are stable.

The effect of insertion of such intermediate layers 55 and 60 will be verified.

In order to raise the robustness with respect to variation of the thickness of the first substrate 10, specifically, it is necessary to lower the rate of change of frequency relative to the change of the thickness of the first substrate 10.

Figure 19:
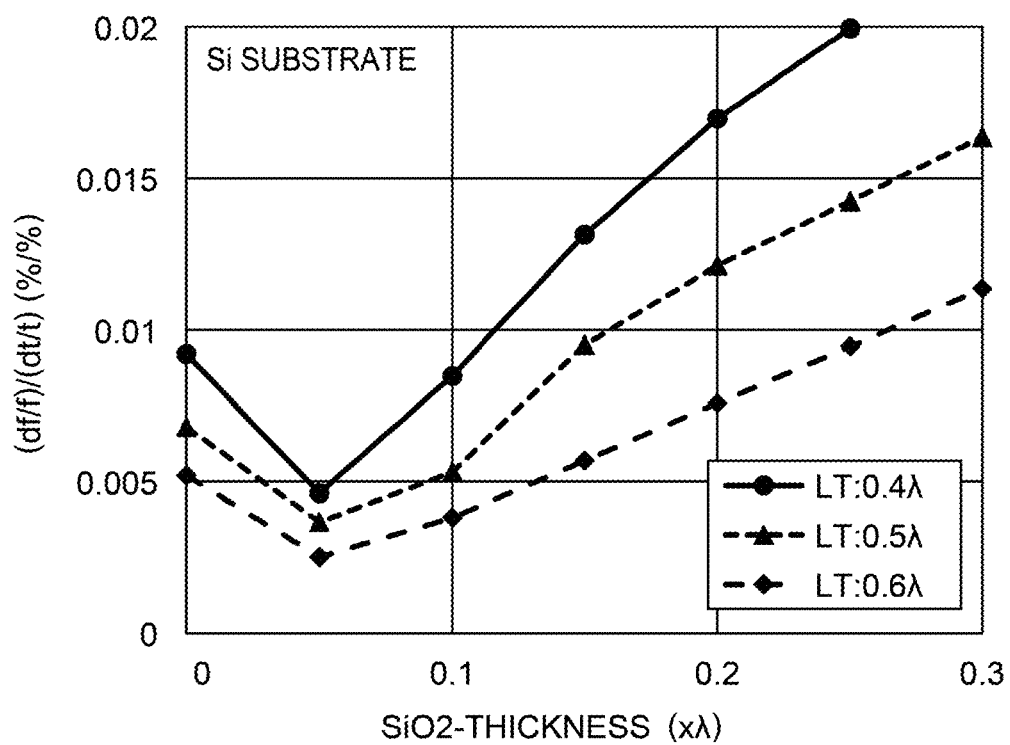
FIG. 19 is a graph calculating the rate of change of frequency of the SAW element relative to the thickness of the second intermediate layer.

FIG. 19 shows the results of simulation of the rate of change of frequency of the SAW element when making the thickness of the first substrate 10 and the thickness of the second substrate 20 different. Note that, in this simulation, the SAW element is given a configuration not including the first intermediate layer 55 and basically comprising the first substrate 10, second intermediate layer 60, and second substrate 20. That is, the configuration of the SAW element 30A is formed.

Further, the first substrate 10 was formed by an LT substrate, the second intermediate layer 60 was formed by an SiO$_2$ layer, and the second substrate 20 was formed by an Si single crystal having the plane orientation (111).

In FIG. 19, the abscissa shows the thickness of the second intermediate layer 60, and the ordinate shows the rate of change of frequency. The numerical value where the thickness of the second intermediate layer 60 is 0λ indicates the rate of change of frequency in a SAW element having a configuration in which the second intermediate layer 60 is not included and the first substrate 10 and the second substrate 20 are directly bonded.

As apparent from FIG. 19, it could be confirmed that both of the rate of change of frequency and the variation of the rate of change of frequency due to the difference of thicknesses of the first substrate 10 could be reduced by inserting the second intermediate layer 60 with a suitable thickness. It was confirmed from the above description that the robustness could be raised by insertion of the second intermediate layer 60.

On the other hand, when the thickness of the second intermediate layer 60 exceeds a certain value, as confirmed, the rate of change of frequency was rather made larger and also the variation of the rate of change of frequency due to the variation of thicknesses of the first substrate 10 became larger (see the case where the SiO$_2$ thickness is 0.1λ or more in FIG. 19).

As will be explained later, in the case where a material having conductivity such as an Si single crystal substrate is used or the case where a material having a grain boundary causing propagation loss of an acoustic wave such as a ceramic board is used for forming the second substrate 20, loss is caused when an electric field supplied by the IDT electrode and surface acoustic wave are distributed on the second substrate 20 side, so the characteristics of the acoustic wave element deteriorate. In order to avoid this problem, desirably the thickness of the second intermediate layer 60 is greater so far as there is no influence upon the characteristics and manufacturing process. However, due to the phenomenon explained above, the thickness of the second intermediate layer 60 is restricted.

Figure 20A:
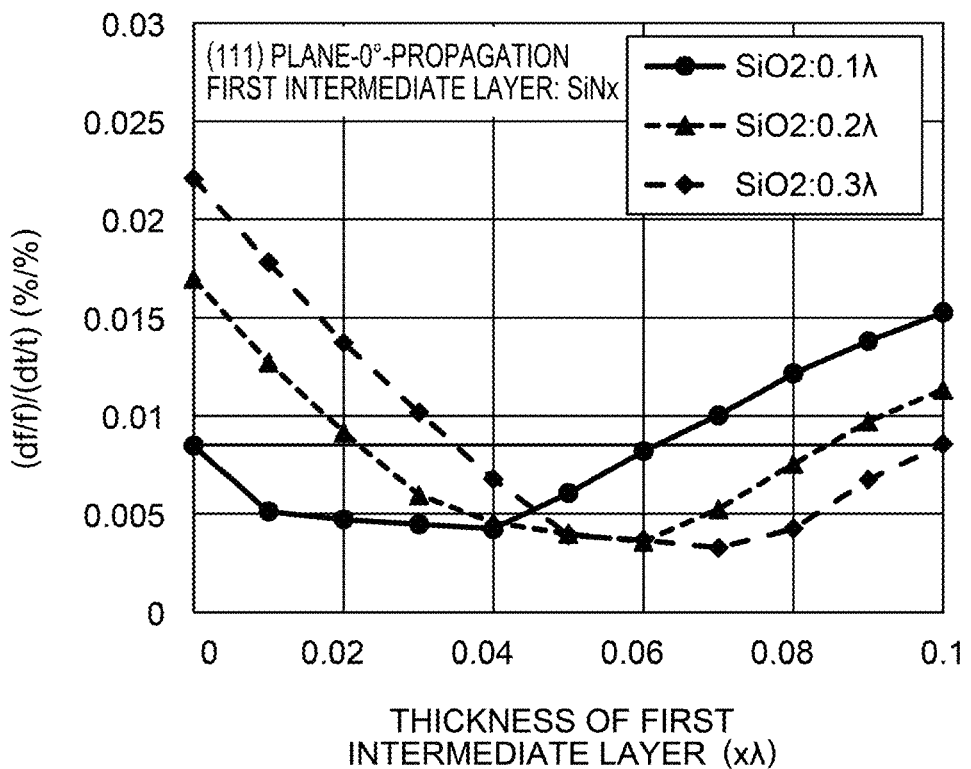
FIG. 20A is a graph calculating the rate of change of frequency of the SAW element relative to the thickness of a first intermediate layer.

In order to keep down the increase of the rate of change of frequency along with the increase of thickness of the second intermediate layer 60, in the present embodiment, as shown in FIG. 18, a SAW element 30B further provided with the first intermediate layer 55 was formed. FIG. 20A shows the results of simulation of the rate of change of frequency of the SAW element 30B when making the thicknesses of the first and second intermediate layers 55 and 60 different in the SAW element 30B.

In FIG. 20A, the abscissa shows the thickness of the first intermediate layer 55 standardized by the wavelength λ, and the ordinate shows the rate of change of frequency. Note that, the value when the value on the abscissa is 0λ indicates the rate of change of frequency of the SAW element which is not provided with the first intermediate layer 55, but is provided with only the second intermediate layer 60. Further, the thickness of the first substrate 10 was made the 0.4λ which was most influenced by variations in thicknesses of the first substrate 10 and second intermediate layer 60 among the simulation conditions shown in FIG. 19. Further, the first intermediate layer 55 was formed by SiNx.

As apparent also from FIG. 20A, it was confirmed that the rate of change of frequency could be made smaller by the first intermediate layer 55 even in a case where the thickness of the second intermediate layer 60 was 0.1λ or more. Further, it was confirmed that variation of the rate of change of frequency could be suppressed even if the thickness of the second intermediate layer 60 greatly varied. That is, according to the SAW element 30B in the present disclosure, not only can the robustness relative to the variation of thickness of the first substrate 10 be raised by the second intermediate layer 60, but also the robustness relative to the variation of thickness of the second intermediate layer 60 can be raised by the first intermediate layer 55.

Further, due to the first intermediate layer 55, the thickness of the second intermediate layer 60 can be increased. In addition, the effect of the first intermediate layer 50 is added as well. Therefore the amounts of the electric field supplied by the IDT electrode 31 and surface acoustic wave distributed on the second substrate 20 side can be reduced. For this reason, loss of the acoustic wave element can be reduced.

Figure 20B:
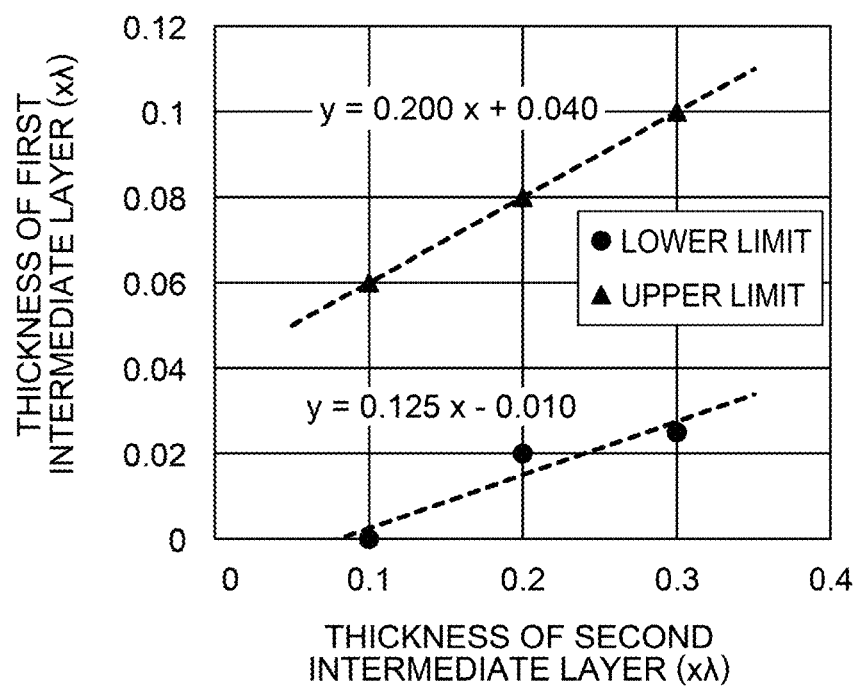
FIG. 20B is a graph calculating the range of the thickness of the first intermediate layer showing a good rate of change of frequency and is a graph showing a relationship of thickness between the first intermediate layer and a second intermediate layer.

FIG. 20B is a graph plotting the range of thickness of the first intermediate layer 55 where the rate of change of frequency becomes smaller than the rate of change of frequency at the time when there is no first intermediate layer 55 (0λ) and the thickness of the second intermediate layer 60 is 0.1λ (about 0.0085%/%) against the thickness of the second intermediate layer 60. By matching with this plot, the range of thickness of the first intermediate layer 55 capable of making the rate of change of frequency smaller can be defined by the following equation:

$$0.13A - 0.010 \leq B \leq 0.20A + 0.040$$

Where, λ is the thickness (unit: dimensionless, ×λ) of the second intermediate layer 60, and B is the thickness (unit: dimensionless, ×λ) of the first intermediate layer 50.

Note that, when the same simulations as those in FIGS. 20A and 20B were carried out also for the times when the thickness of the first substrate 10 was 0.5λ and 0.6λ, the same tendency was confirmed. That is, no matter what the thicknesses of the first substrate 10 and the second intermediate layer 60, the rate of change of frequency can be controlled to 0.005 or less by the first intermediate layer 55. In particular, when the thickness of the first intermediate layer 55 is set to 0.04λ to 0.05λ, even if the thickness of the second intermediate layer 60 is changed in a range of 0.1λ to 0.3λ, change of the frequency can be suppressed. From this fact, the robustness relative to the thickness of the second intermediate layer 60 can be raised.

Further, in the present disclosure, when the second substrate 20 is formed by an Si single crystal substrate and the second intermediate layer 60 is formed by SiO$_2$, the second intermediate layer 60 can be formed by the thermal oxidation process. The thermal oxidation process can simultaneously form oxide films having a small variation in characteristics and thicknesses and having a high quality on a large amount of substrates, therefore the productivity is greatly improved. Further, when the first intermediate layer 55 is formed by SiNx, a process forming a nitride film by thermal CVD on the above thermally oxidized Si single crystal substrate can be employed, therefore the productivity can be further greatly improved.

Further, in the configuration in the present disclosure, by providing the intermediate layers 55 and 60 between the first substrate 10 and the second substrate 20, diffusion of lithium, tantalum, or oxygen from the LT single crystal or $LiNbO_3$ single crystal used for forming the first substrate 10 to the Si substrate used for forming the second substrate 20 can be suppressed.

Note that, simulation equal to that explained above was carried out for each of the time when AlN having a faster acoustic velocity than the first substrate 10 was used for forming the first intermediate layer 55 and the time when $TiO_2$ and $Ta_2O_5$ having slower acoustic velocities than the first substrate 10 were used for forming the same. As a result, the same results as those in FIGS. 20A and 20B were obtained when AlN was used. On the other hand, when $TiO_2$ and $Ta_2O_5$ were used, the effect of improvement of robustness as explained above due to existence of these layers was not seen. Conversely, a situation increasing of the rate of change of frequency was confirmed. Accordingly, the first intermediate layer 55 must be faster in the acoustic velocity than the first substrate 10.

Figure 21A:
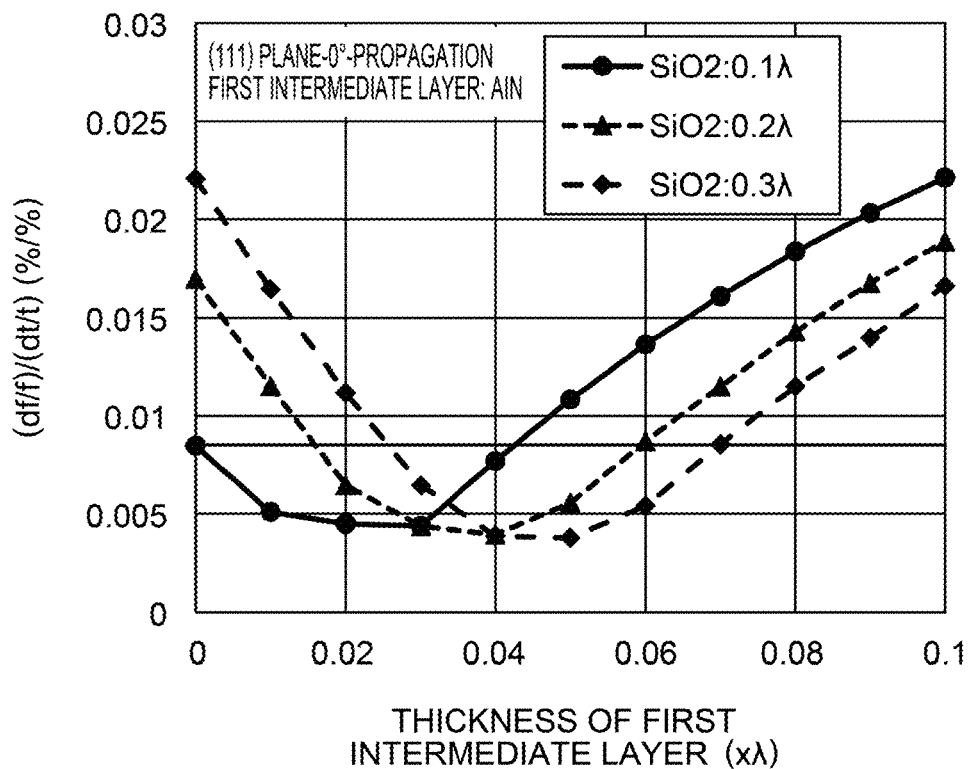
FIG. 21A is a graph calculating the rate of change of frequency of the SAW element relative to the thickness of the first intermediate layer.
Figure 21B:
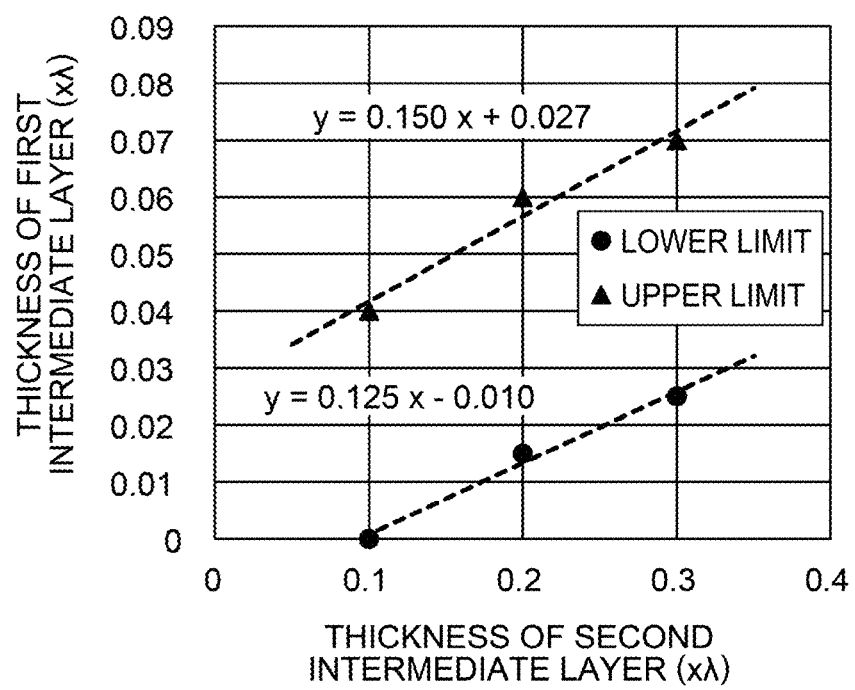
FIG. 21B is a graph calculating the range of the thickness of the first intermediate layer showing a good rate of change of frequency.

FIG. 21A shows simulation results corresponding to FIGS. 20A and 20B at the time when AlN is used for forming the first intermediate layer 55. AlN is faster in acoustic velocity than the SiNx. Therefore, compared with the time when SiNx was used for forming the first intermediate layer 55, the thickness at which the rate of change of frequency becomes the minimum has become thinner. However, as understood, substantially the same tendency as that in FIGS. 20A and 20B is shown. Further, in the same way as FIGS. 20A and 20B, a range of thickness of the first intermediate layer 55 showing a good rate of change of frequency can be found as shown in FIG. 21B. The range of that is represented by the following equation.

$$0.13A-0.010 \leq C \leq 0.15A+0.027$$

Where, A is the thickness (unit: ×λ) of the second intermediate layer 60, and C is the thickness (unit: ×λ) when use is made of AlN as the first intermediate layer 50.

Figure 22A:
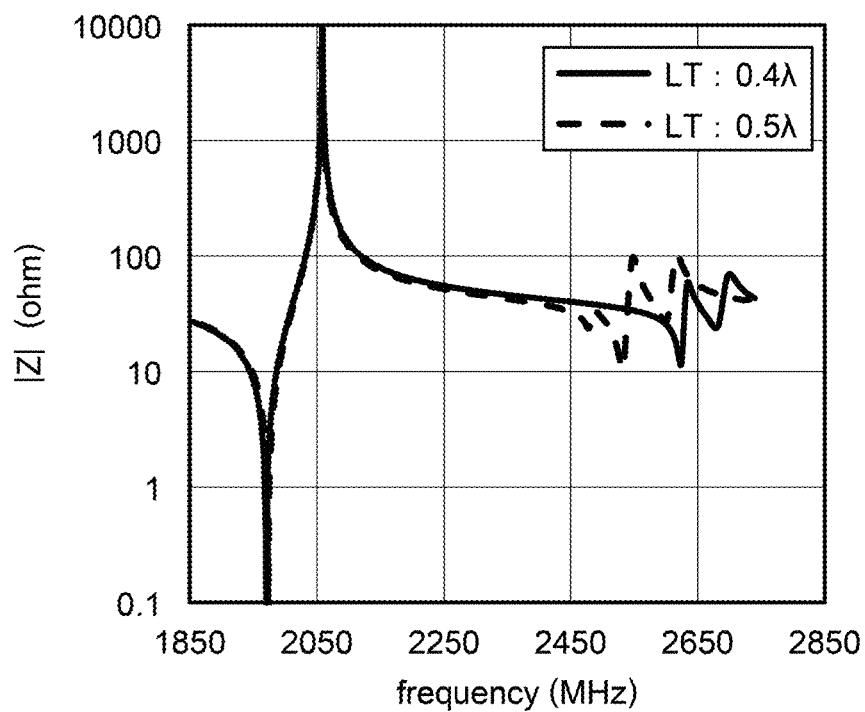
FIGS. 22A and 22B are graphs showing the frequency characteristics of SAW elements in the present disclosure.
Figure 22B:
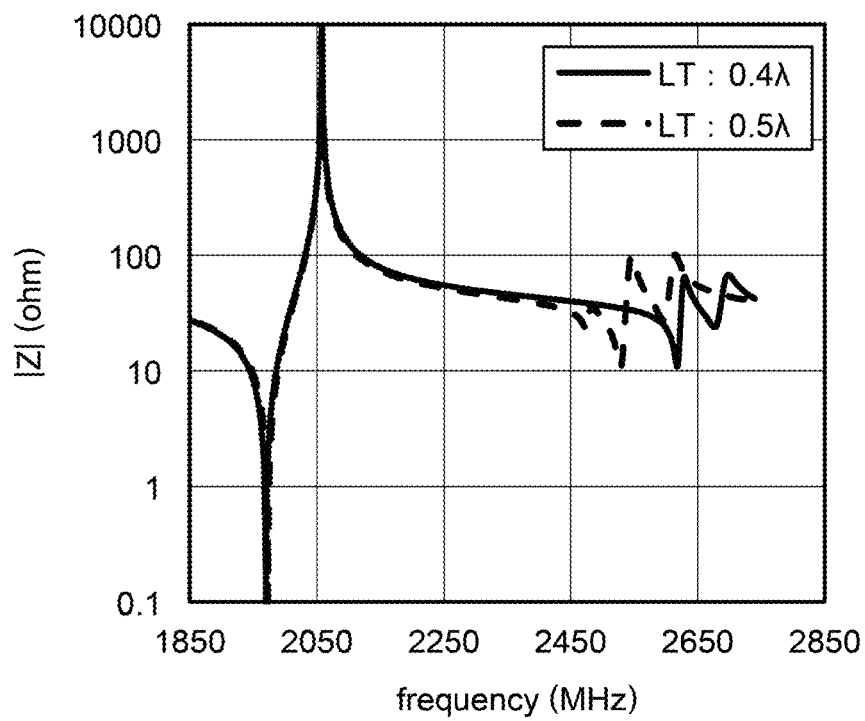

Further, FIGS. 22A and 22B show the results of simulation of the frequency characteristic of the SAW element 30B in the present disclosure. In FIGS. 22A and 22B, the abscissas show the frequency (unit: MHz), and the ordinates show the absolute value (unit: Ω) of impedance. In these simulations, the first substrate 10 was the 42° Y-cut, and X-propagated LT substrate (thicknesses are 0.4λ and 0.5λ), the second substrate 20 was formed by Si having the plane orientation (111) and propagation angle ψ=0° which will be explained later, the pitch of the IDT electrode in the SAW element 30B was 1 μm, the electrode material was Al, and the thickness thereof was set to 0.08λ.

FIG. 22A shows the characteristics of the SAW element in a case where the first intermediate layer 55 is formed by SiNx having a thickness of 0.04λ and the second intermediate layer 60 is formed by $SiO_2$ having a thickness of 0.2λ. FIG. 22B shows the characteristics of the SAW element in a case where the first intermediate layer 55 is formed by AlN having a thickness of 0.03λ and the second intermediate layer 60 is formed by $SiO_2$ having a thickness of 0.2λ.

As apparent from FIGS. 22A and 22B, according to the SAW element 30B in the present disclosure, even if the thickness of the first substrate 10 varies, there is no variation in any of the resonance frequency, antiresonance frequency, and difference between the resonance frequency and the antiresonance frequency, therefore it was confirmed that a change of frequency characteristics could be suppressed. Further, it is seen that the robustness of the SAW element 30B is high even compared with the case where the first intermediate layer 55 and second intermediate layer 60 are not provided (see FIG. 4A).

(Modification of SAW Element 30B)

The example explained above did not refer to the plane orientation of the second substrate 20, the rotation angle (ψ propagation angle) of the crystal structure configuring the second substrate 20 relative to the X-axis of the first substrate 10, and the like. However, they may be made a specific plane orientation and rotation angle as well. Below, the suitable plane orientation and rotation angle will be studied.

Simulations were carried out for the rate of change of frequency of the SAW element 30B when using a Si single crystal substrate for forming the second substrate 20 by making the thicknesses of the intermediate layers 55 and 60 different and making the plane orientation and the rotation angle (ψ propagation angle) of the Si single crystal relative to the X-axis of the first substrate 10 different.

Figure 23A:
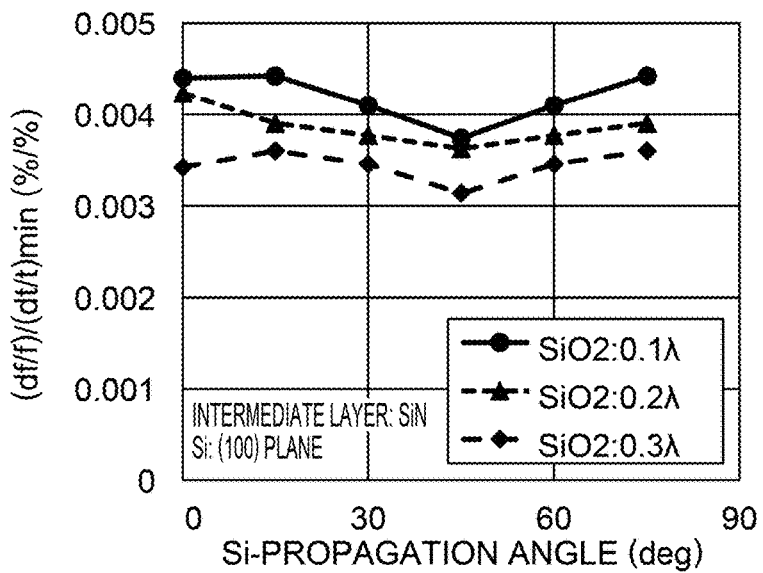
FIGS. 23A to 23C are graphs respectively showing the rates of change of frequency of the acoustic wave element when making the crystal plane and the φ propagation angle different.
Figure 23B:
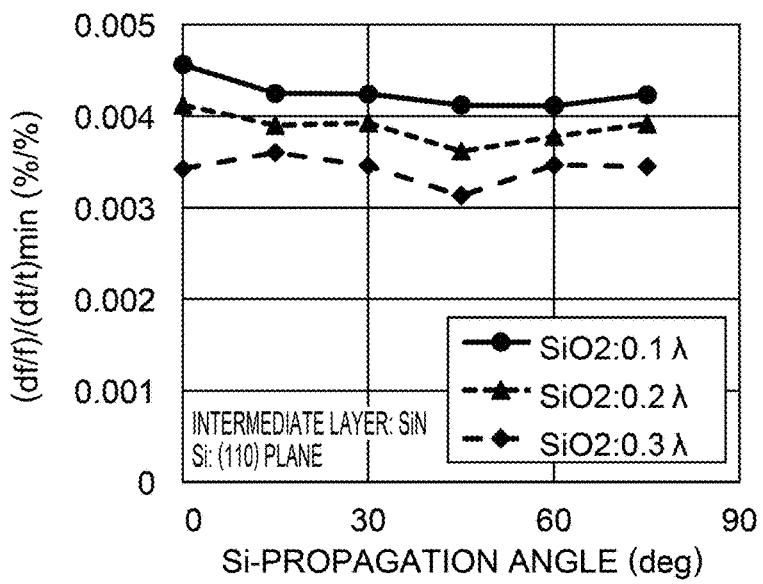
Figure 23C:
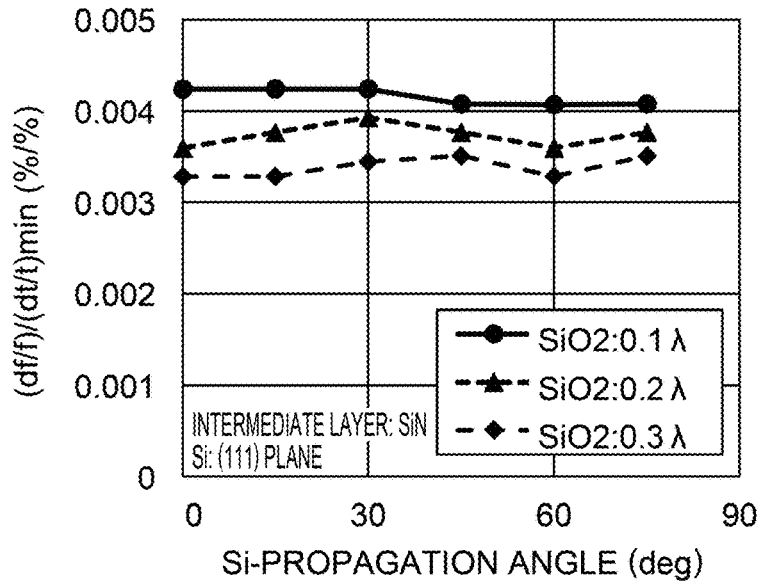

Here, the results of simulations of the rate of change of frequency of the SAW element by changing ψ for each plane orientation when making the plane orientations of the second substrate 20 (100), (110), and (111) will be shown in FIGS. 23A to 23C. In FIGS. 23A to 23C, the abscissas show the ψ propagation angle (unit: deg), and the ordinates show the minimum value of the rate of change of frequency. Further, the SiNx layer was used for forming the first intermediate layer 55. Further, $SiO_2$ was used for forming the second intermediate layer 60, and the thickness thereof was changed in a range of 0.1λ to 0.3λ. Note that, the thickness of the first intermediate layer 55 was made a thickness where the rate of change of frequency became the smallest relative to each plane orientation, ψ, and thickness of the second intermediate layer 60. The specific thicknesses of the first intermediate layer 55 are 0.03 to 0.05λ when the thickness of $SiO_2$ is 0.1λ, 0.06λ when the thickness of $SiO_2$ is 0.2λ, and 0.07λ when the thickness of $SiO_2$ is 0.3λ. For this reason, the ordinates indicate the minimum value of the rate of change of frequency.

The generally used Si single crystal wafer has a plane orientation (111) and an orientation flat (110). When this is bonded to a generally used LT substrate (orientation flat direction [100], cut so that the orientation flat becomes vertical to the X-axis as shown in FIG. 6) so that the orientation flats are aligned, an Si (111) plane 0°-propagating part is obtained.

As apparent from these graphs, it was confirmed that when the plane orientation of the second substrate 20 was (100) or (110), the rate of change of frequency became small when the propagation angle was set to 45°±15°. The variation of the rate of change of frequency due to the propagation angle repeats by a cycle of 90° or 180°, therefore the minimum value is taken in the same way also in cases of 135°±15°, 225°±15°, and 315°±15°.

From the above description, in the case where the plane orientation of the second substrate 20 is (100) or (110) or a plane orientation which is equal to them, by setting the propagation angle to 45°±15°, a SAW element excellent in robustness can be provided. Further, in all plane orientations, it was confirmed that the rate of change of frequency could be made smallest when increasing the thickness of the second intermediate layer 60 up to about 0.3λ.

Further, when the plane orientation of the second substrate 20 was (111), a large frequency change due to the propagation angle was not confirmed. However, by setting the propagation angle at 0°±15° or 60°±15°, the rate of change of frequency can be made the smallest.

Further, variations of the rates of change of frequency were simulated for the 0°-propagating part and 45°-propagating part when making the plane orientation of the second substrate 20 the (100) plane by making the thicknesses of the first intermediate layer 55 different. The results thereof will be shown in FIGS. 24A and 24B.

Figure 24A:
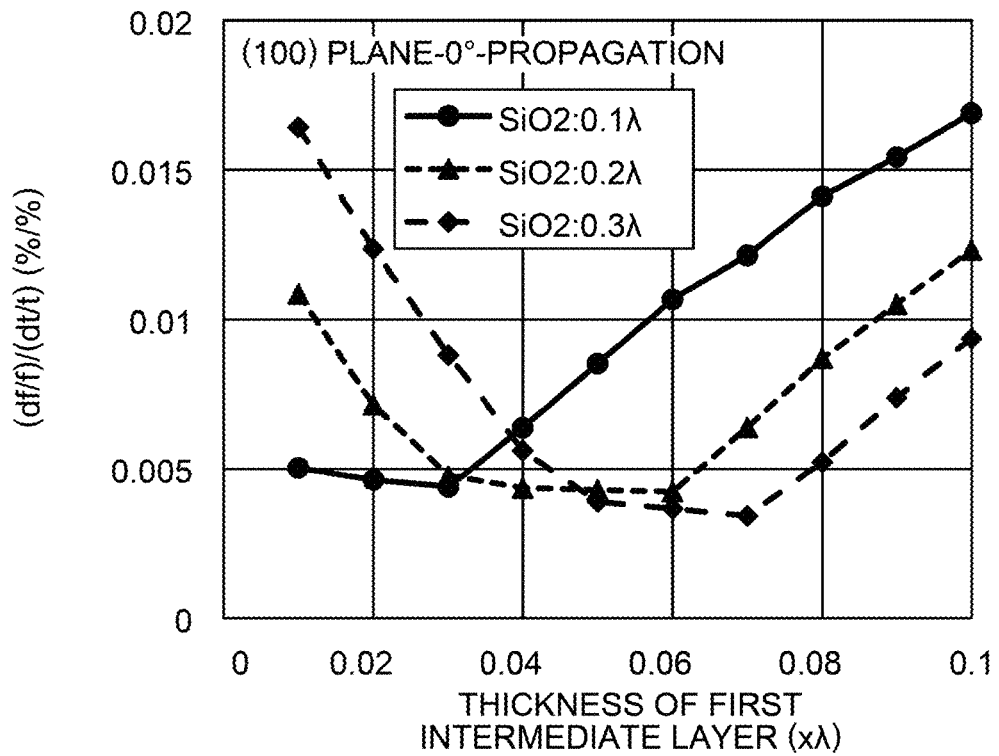
FIGS. 24A and 24B are graphs calculating the rate of change of frequency of the acoustic wave element relative to the thickness of the first intermediate layer in another example of the present disclosure.
Figure 24B:
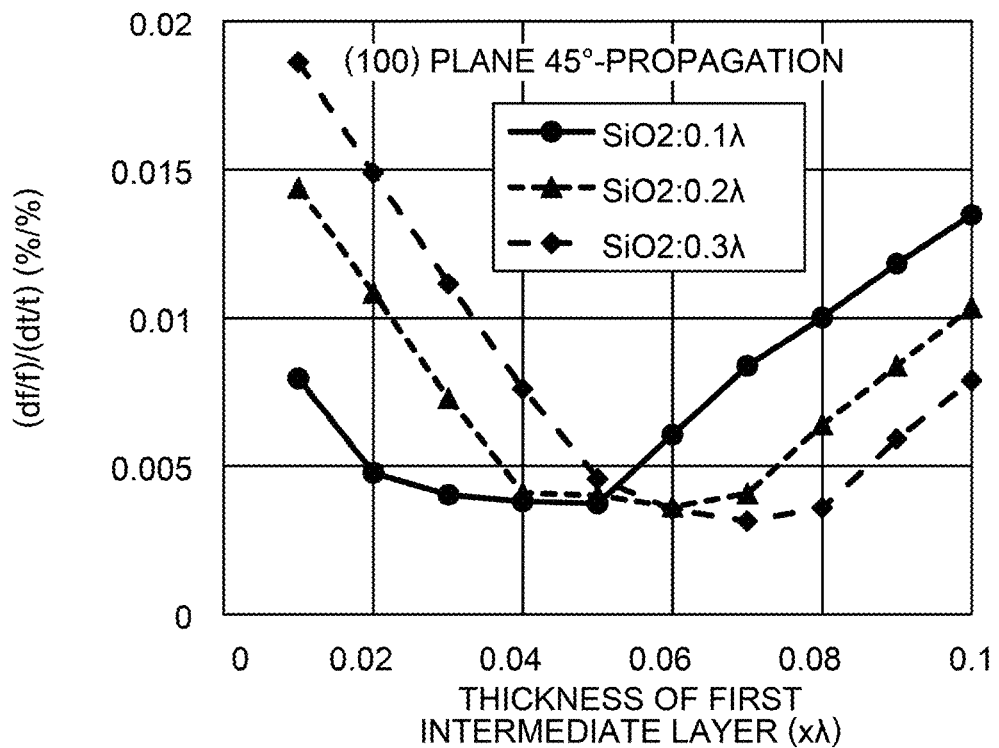

In FIGS. 24A and 24B, the abscissas show the thickness of the first intermediate layer 55, and the ordinates show the rate of change of frequency. FIG. 24A shows the results of the 0°-propagating part, and FIG. 24B shows the results of the 45°-propagating part. As apparent from FIGS. 24A and 24B, according to the 45°-propagating part, the minimum value of the rate of change of frequency can be made smaller compared with the 0°-propagating part. Further, the thickness of the first intermediate layer 55 realizing this can be made thicker compared with the 0°-propagating part. This shows the effect of reducing the loss of the acoustic wave element explained before and in addition shows that the control of the thickness of the first intermediate layer 55 becomes easy, therefore a SAW element 30B having a higher productivity can be formed.

Note that, the same simulations as those in FIGS. 23A to 23C and FIGS. 24A and 24B explained above were carried out for the case where the material for the first intermediate layer 55 was made AlN as well, but the same effects were obtained.

(Modification of SAW Element 30B)

In the example explained above, there was no particular restriction on the resistivity of the second substrate 20. However, the resistivity may be 5000 Ω·cm or less as well.

Here, the first intermediate layer 55 is smaller in thickness compared with the second intermediate layer 60, therefore the effect of suppressing electromagnetic coupling of the IDT electrode 31 and the second substrate 20 becomes greater in the second intermediate layer 60 although the first intermediate layer 55 also has the effect.

Therefore, using FIGS. 17A to 17C each showing the correlation between the resistivity of the second substrate 20 and the maximum phase of the SAW element when the first intermediate layer 55 is not provided as a reference, if the resistivity of the second substrate 20 is 1000 Ω·cm or more, the loss due to the resistivity of the second substrate 20 can be suppressed by making the thickness of the second intermediate layer 60 to 0.3λ. Further, such a thickness of the second intermediate layer 60 can be realized while keeping the rate of change of frequency as it is by interposing the first intermediate layer 55. In the same way, if the resistivity of the second substrate 20 is 5000 Ω·cm or more, occurrence of loss due to the second substrate 20 can be suppressed by making the thickness of the second intermediate layer 60 to 0.2λ.

From the above description, when making the thickness of the second intermediate layer 60 0.2λ or more, the resistivity of the second substrate 20 can be made 5000 Ω·cm or less as well. Further, when making the thickness of the second intermediate layer 60 0.3λ or more, the resistivity of the second substrate 20 can be made 1000 Ω·cm or less as well. Such a thickness of a second intermediate layer 60 is a thickness suitable for raising the robustness as shown in FIGS. 23A to 23C, FIGS. 24A and 24B, and the like and can be sufficiently realized.

As explained in FIG. 19, if the thickness of the second intermediate layer 60 was made 0.1λ or more without providing the first intermediate layer 55, there was a problem of increase of the rate of change of frequency. However, by introducing the first intermediate layer 55 as in the present disclosure, even if second intermediate layers 60 having these thicknesses are employed, the rates of change of frequency can be kept low.

That is, it becomes possible to provide the SAW element 30B in which the total thickness of the first substrate 10, first intermediate layer 55, and second intermediate layer 60 is less than 1λ and therefore high characteristics free from bulk wave spurious resonance can be realized and, at the same time, in which a portion of the SAW distributes in the first intermediate layer 55, second intermediate layer 60, and second substrate 20, therefore the robustness can be raised while the electromagnetic coupling with the IDT electrode 31 by the second substrate 20 is suppressed and therefore there is little loss.

(Modification of SAW Element 30B)

In the present disclosure, an example in which mainly use was made of a Si single crystal substrate for forming the second substrate 20 was shown. However, as the second substrate 20, use may be also made of one obtained by forming a material layer having a faster transverse acoustic wave velocity than the first substrate and the intermediate layer on another substrate by film formation or another method. Even in this case, if the thickness of the material layer is sufficiently thick (roughly 1λ or more), the material layer substantially functions as the second substrate 20, therefore the effects of the present invention are obtained.

The following other inventions can be extracted from the present disclosure.

(Concept 1)

An acoustic wave element including an IDT electrode including a plurality of electrode fingers and exciting a surface acoustic wave, a first substrate configured by a piezoelectric crystal on an upper surface of which the IDT electrode is located, and a second substrate configured by an Si single crystal which is bonded to a lower surface of the first substrate, wherein a thickness D of the first substrate and Euler angles ($\varphi$, $\theta$, $\psi$) of the second substrate satisfy any of the following relationships (1) to (3):

(1) At the time of $\varphi=-45°$ and $\theta=-54.5°$, $$43.49 \times D + 0.55 + 120 \times \alpha \leq \psi \leq -44.86 \times D + 119.04 + 120 \times \alpha,$$

$$0.4p \leq D \leq 1.1p,$$

where, $\alpha=0, 1, 2$, (2) At the time of $\varphi=-45°$ and $\theta=-90°$, $$-60 + 180 \times \alpha \leq \psi \leq 60 + 180 \times \alpha, \text{ and}$$

$$0.4p \leq D \leq 0.8p,$$

where, $\alpha=0, 1$, and (3) At the time of $\varphi=90°$ and $\theta=90°$, $$20 \times D + 10 + 90 \times \alpha \leq \psi \leq -20 \times D + 80 + 90 \times \alpha, \text{ and}$$

$$0.4p \leq D \leq 0.8p,$$

where, $\alpha=0, 1, 2, 3$.

(Concept 2)

An acoustic wave element including an IDT electrode including a plurality of electrode fingers and exciting a surface acoustic wave, a first substrate configured by a piezoelectric crystal on an upper surface of which the IDT electrode is located, a second substrate configured by an Si single crystal which is located on a lower surface side of the first substrate, and an intermediate layer configured by SiOx which is located between the first substrate and the second substrate, wherein a thickness D of the first substrate and Euler angles ($\varphi$, $\theta$, $\psi$) of the second substrate satisfy any of the following relationships (1) to (3):

(1) At the time of $\varphi=-45°$ and $\theta=-54.5°$, $$41.1 \times D + 2.33 + 120 \times \alpha \leq \psi \leq -40.07 \times D + 115.48 + 120 \times \alpha,$$

$$0.4p \leq D \leq 1.1p,$$

where, $\alpha = 0, 1, 2,$ (2) At the time of $\varphi=-45°$ and $\theta=-90°$, $$75.23 \times D - 104.55 + 180 \times \alpha \leq \psi \leq -75.23 \times D + 104.55 + 180 \times \alpha, \text{ and}$$

$$0.4p \leq D \leq 1.1p,$$

where, $\alpha = 0, 1,$ and, (3) At the time of $\varphi=90°$ and $\theta=90°$, $$22.86 \times D + 8.48 + 90 \times \alpha \leq \psi \leq -22.86 \times D + 81.52 + 90 \times \alpha, \text{ and}$$

$$0.4p \leq D \leq 0.9p,$$

where, $\alpha = 0, 1, 2, 3.$

REFERENCE SIGNS LIST

1: composite substrate
10: first substrate
20: second substrate
30: acoustic wave element
31: IDT electrode
50: intermediate layer
55: first intermediate layer
60: second intermediate layer

The invention claimed is:

1. An acoustic wave element comprising:
an IDT electrode comprising a plurality of electrode fingers and exciting a surface acoustic wave,
a first substrate, which is a lithium tantalite single crystal substrate, on an upper surface of which the IDT electrode is located, which has a thickness of less than a wavelength $\lambda$, of the surface acoustic wave defined by 2 times a repetition interval of the plurality of electrode fingers and is configured by a piezoelectric crystal,
a second substrate which is directly or indirectly bonded to a lower surface of the first substrate and is configured by a material satisfying equation (1) where an acoustic impedance is I (Mrayl) and a transverse acoustic wave velocity is V (m/s):

$$-0.0085 \times V + 45.75 \leq I \leq -0.0085 \times V + 65.75 \quad (1)$$

an intermediate layer between the first substrate and the second substrate, wherein
the intermediate layer comprises a first surface and a second surface, the first surface bonded to the lower surface of the first substrate, and is configured by a material having a slower transverse acoustic wave velocity than that of the first substrate, and
the second substrate is faster in transverse acoustic wave velocity than the first substrate and the intermediate layer, and
the second substrate is configured by an Si single crystal with a plane orientation of (100), in which when Euler angles are ($\varphi$, $\theta$, $\psi$), $\psi$ becomes any of $-30°$ to $30°$, $60°$ to $120°$, $150°$ to $210°$, and $240°$ to $300°$ in relation to the direction of propagation in the superposed first substrate.

2. The acoustic wave element according to claim 1, wherein a resistivity of the second substrate is 5000 $\Omega \cdot$cm or more.

3. The acoustic wave element according to claim 1, wherein the thickness of the first substrate is in a range of $0.2\lambda$ to $0.8\lambda$.

4. The acoustic wave element according to claim 1, wherein the intermediate layer is configured by a material having a smaller dielectric constant than that of the second substrate.

5. The acoustic wave element according to claim 1, wherein
the intermediate layer is configured by silicon oxide and has a thickness of $0.02\lambda$ to $0.08\lambda$.

6. The acoustic wave element according to claim 1, wherein:
the intermediate layer is configured by silicon oxide and has a thickness of $0.1\lambda$ or more.

7. The acoustic wave element according to claim 1, wherein
the intermediate layer is configured by silicon oxide, a thickness thereof is $0.1\lambda$ or more, and
a resistivity of the second substrate is 1000 $\Omega \cdot$cm or more.

8. The acoustic wave element according to claim 1, wherein
the intermediate layer is configured by silicon oxide, a thickness thereof is $0.05\lambda$, or more, and
a resistivity of the second substrate is 5000 $\Omega \cdot$cm or more.

9. The acoustic wave element according to claim 1, wherein the first substrate is an X-propagated, rotated, and Y-cut lithium tantalate single crystal substrate.

10. The acoustic wave element according to claim 1, wherein the thickness of the first substrate is greater than $0.2\lambda$ and is $0.6\lambda$ or less.

11. The acoustic wave element according to claim 1, further comprising:
an insulation layer which is located on the upper surface of the first substrate and is configured by a material having a smaller dielectric constant than that of the first substrate and
an electrode layer which is located on the insulation layer and is electrically connected with the IDT electrode.

12. The acoustic wave element according to claim 1, wherein
when a pitch of the electrode fingers is "p", the thickness D of the first substrate and the Euler angles of the second substrate satisfy a following relationship $$20 \times D + 10 + 90 \times \alpha \leq \psi \leq -20 \times D + 80 + 90 \times \alpha, \text{ and}$$

$$0.4p \leq D \leq 0.8p,$$

where, $\alpha = 0, 1, 2, 3.$

13. An acoustic wave element comprising:
an IDT electrode comprising a plurality of electrode fingers and exciting a surface acoustic wave,
a first substrate, which is a lithium tantalite single crystal substrate, on an upper surface of which the IDT electrode is located, which has a thickness of less than a wavelength $\lambda$ of the surface acoustic wave defined by 2 times of a repetition interval of the plurality of electrode fingers and is configured by a piezoelectric crystal,
an intermediate layer which comprises a first surface and a second surface, the first surface bonded to a lower surface of the first substrate, and which is configured by a material having a slower transverse acoustic wave velocity than that of the first substrate, and a second substrate is bonded to the second surface and is configured by an Si single crystal with a plane orientation of (100), in which when Euler angles are ($\varphi$, $\theta$, $\psi$), $\psi$ becomes any of −30° to 30°, 60° to 120°, 150° to 210°, and 240° to 300° in relation to the direction of propagation in the superposed first substrate.

14. The acoustic wave element according to claim 13, wherein the intermediate layer is configured by silicon oxide and has a thickness of 0.04$\lambda$, to 0.06$\lambda$.

15. The acoustic wave element according to claim 13, wherein:
the intermediate layer is configured by silicon oxide, and
when the pitch of the electrode fingers is "p", the thickness D of the first substrate and the Euler angles of the second substrate satisfy a following relationship $$22.86 \times D + 8.48 + 90 \times \alpha \leq \psi \leq -22.86 \times D + 81.52 + 90 \times \alpha,$$

and $$0.4p \leq D \leq 0.9p,$$

where, $\alpha$=0, 1, 2, 3.

* * * * *